(12) United States Patent
Ota et al.

(10) Patent No.: US 6,819,861 B2
(45) Date of Patent: Nov. 16, 2004

(54) LAMINATED OPTICAL WAVEGUIDE ARRAY, BEAM COLLECTING DEVICE AND LASER EMISSION DEVICE

(75) Inventors: Hiromichi Ota, Kariya (JP); Yoshinobu Katoh, Toyohashi (JP); Yasuo Niino, Hoi-gun (JP)

(73) Assignee: Toyoda Koki Kabushiki Kaisha, Kariya (JP)

( * ) Notice: Subject to any disclaimer, the term of this patent is extended or adjusted under 35 U.S.C. 154(b) by 0 days.

(21) Appl. No.: 10/606,756

(22) Filed: Jun. 27, 2003

(65) Prior Publication Data

US 2004/0028371 A1 Feb. 12, 2004

(30) Foreign Application Priority Data

Jun. 27, 2002 (JP) .......................................... 2002-188487
Jul. 30, 2002 (JP) .......................................... 2002-221596

(51) Int. Cl.[7] .............................. G02B 6/30; G02B 6/32
(52) U.S. Cl. ............................ 385/146; 385/24; 385/31; 385/33; 385/49; 385/88; 385/105; 385/106; 385/112; 385/113; 385/115; 385/116; 385/119; 385/120; 385/121; 385/123; 385/129; 385/130; 385/131; 385/132; 359/204; 359/364; 250/227.31; 250/227.32
(58) Field of Search ............................... 385/105–123, 385/129–132, 24, 31, 33, 49, 88; 359/204, 364; 250/227.31–227.32

(56) References Cited

U.S. PATENT DOCUMENTS 3,688,159 A * 8/1972 Robbins ...................... 361/717
4,735,495 A   4/1988 Henkes (List continued on next page.)

FOREIGN PATENT DOCUMENTS

EP  1 343 036   9/2003
JP  57-30806    2/1982

(List continued on next page.)

*Primary Examiner*—John R. Lee
*Assistant Examiner*—Bernard E. Souw
(74) *Attorney, Agent, or Firm*—Oblon, Spivak, McClelland, Maier & Neustadt, P.C.

(57) ABSTRACT

A beam collecting device and a laser emission device are disclosed incorporating a laminated optical waveguide array and refraction means therein. The laminated optical waveguide array is composed of a plurality of plate-like optical waveguides made of a material having a predetermined refractive index and a plurality of spacer members having a lower refractive index than that of said optical waveguides and arranged alternately with said optical waveguides. The spacer members take the form of cylindrical members, spherical members or plate-like members. The beam collecting device and laser emission device comprise a semiconductor laser array having a plurality of laser emitting parts arranged in fast and slow axis directions, the optical waveguide array, optical fibers and a collective lens. The laser emitting parts are divided into plural groups separated in the slow axis direction. Each of the optical waveguides collects plural laser beams from the laser emitting parts of a corresponding group aligned in the fast axis direction to an emission surface thereof and emits them to a corresponding one of the optical fibers. The refraction means is provided at the emission surface of each waveguide, at an incidence surface of each optical fiber or therebetween, so that the laser beam emitted from the emission surface of the waveguide at an acute angle is refracted to enter into the optical fiber at a gentle angle. Thus, laser beams entered into each optical fiber, without shining therethrough, are efficiently collected to the collective lens to be emitted to a target position.

14 Claims, 16 Drawing Sheets

U.S. PATENT DOCUMENTS

| | | | | |
|---|---|---|---|---|
| 5,061,029 A | * | 10/1991 | Ishikawa | 385/132 |
| 5,195,152 A | * | 3/1993 | Gupta | 385/49 |
| 5,307,430 A | * | 4/1994 | Beach et al. | 385/31 |
| 5,351,332 A | * | 9/1994 | Cook | 385/116 |
| 5,450,244 A | * | 9/1995 | Fantone | 359/710 |
| 5,546,487 A | * | 8/1996 | Fantone | 385/33 |
| 5,577,148 A | * | 11/1996 | Kamatani | 385/115 |
| 5,850,498 A | * | 12/1998 | Shacklette et al. | 385/129 |
| 5,930,433 A | | 7/1999 | Williamson et al. | |
| 5,943,463 A | * | 8/1999 | Unuma et al. | 385/119 |
| 6,097,871 A | * | 8/2000 | De Dobbelaere et al. | 385/129 |
| 6,229,831 B1 | * | 5/2001 | Nightingale et al. | 372/36 |
| 6,240,119 B1 | * | 5/2001 | Ventrudo | 372/96 |
| 6,304,692 B1 | * | 10/2001 | Sappey et al. | 385/24 |
| 6,306,563 B1 | * | 10/2001 | Xu et al. | 430/321 |
| 6,307,995 B1 | | 10/2001 | Veligdan | |
| 6,312,166 B1 | * | 11/2001 | Zediker et al. | 385/88 |
| 6,459,840 B1 | * | 10/2002 | Sato et al. | 385/129 |
| 6,549,709 B1 | * | 4/2003 | De Dobbelaere et al. | 385/49 |
| 6,549,840 B1 | * | 4/2003 | Mikami et al. | 701/69 |
| 6,606,443 B2 | * | 8/2003 | Sato et al. | 385/129 |
| 2001/0031122 A1 | * | 10/2001 | Lackritz et al. | 385/131 |
| 2003/0007765 A1 | * | 1/2003 | Sato et al. | 385/129 |
| 2004/0028371 A1 | * | 2/2004 | Ota et al. | 385/146 |
| 2004/0033024 A1 | * | 2/2004 | Remillard et al. | 385/49 |

FOREIGN PATENT DOCUMENTS

| | | |
|---|---|---|
| JP | 5-80319 | 4/1993 |
| JP | 2000-98191 | 4/2000 |

* cited by examiner

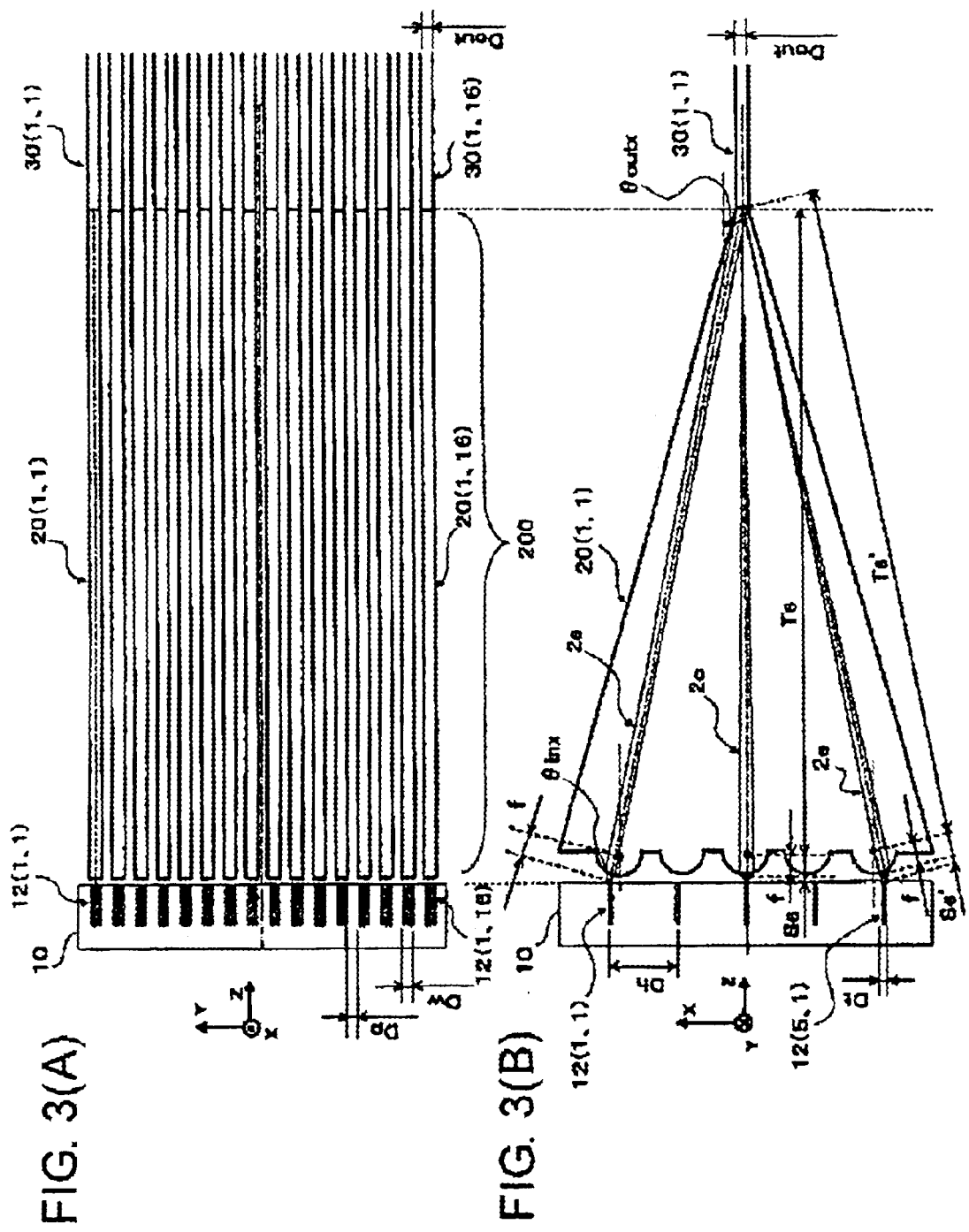

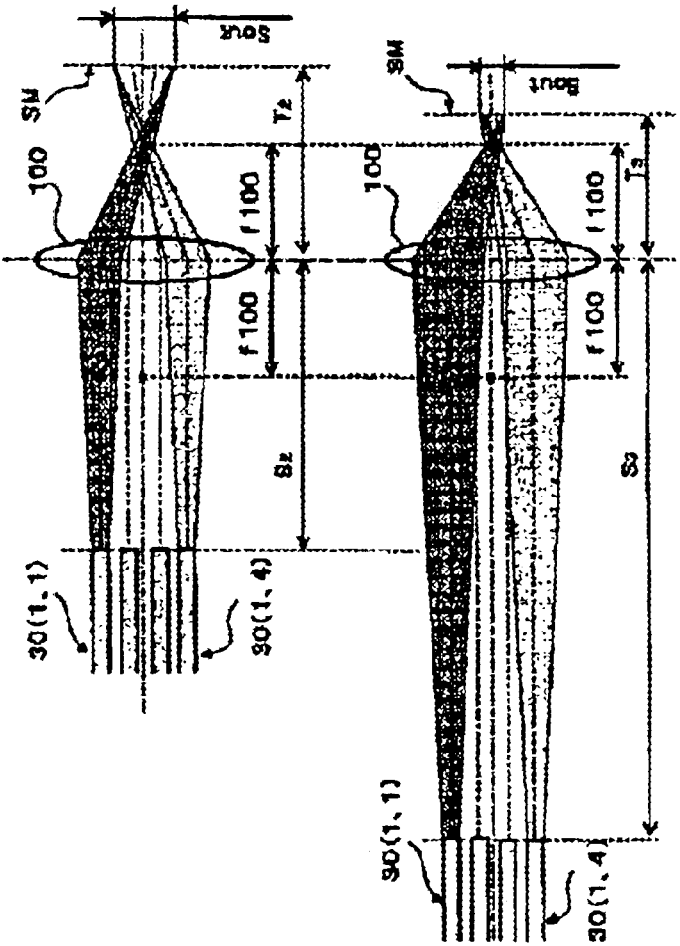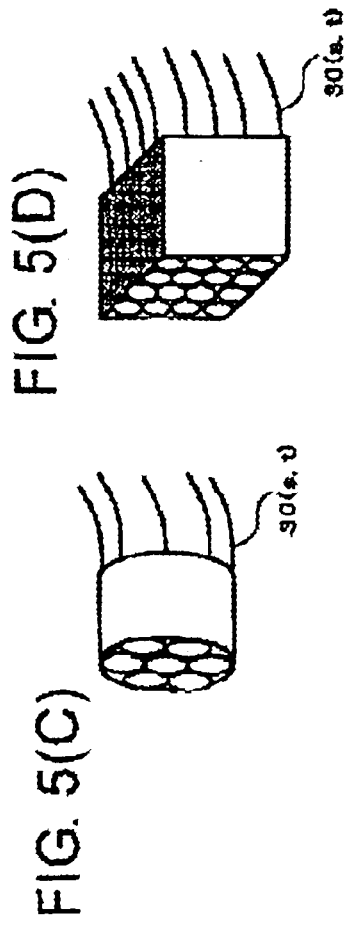
FIG. 5(A) FIG. 5(B) FIG. 5(C) FIG. 5(D)

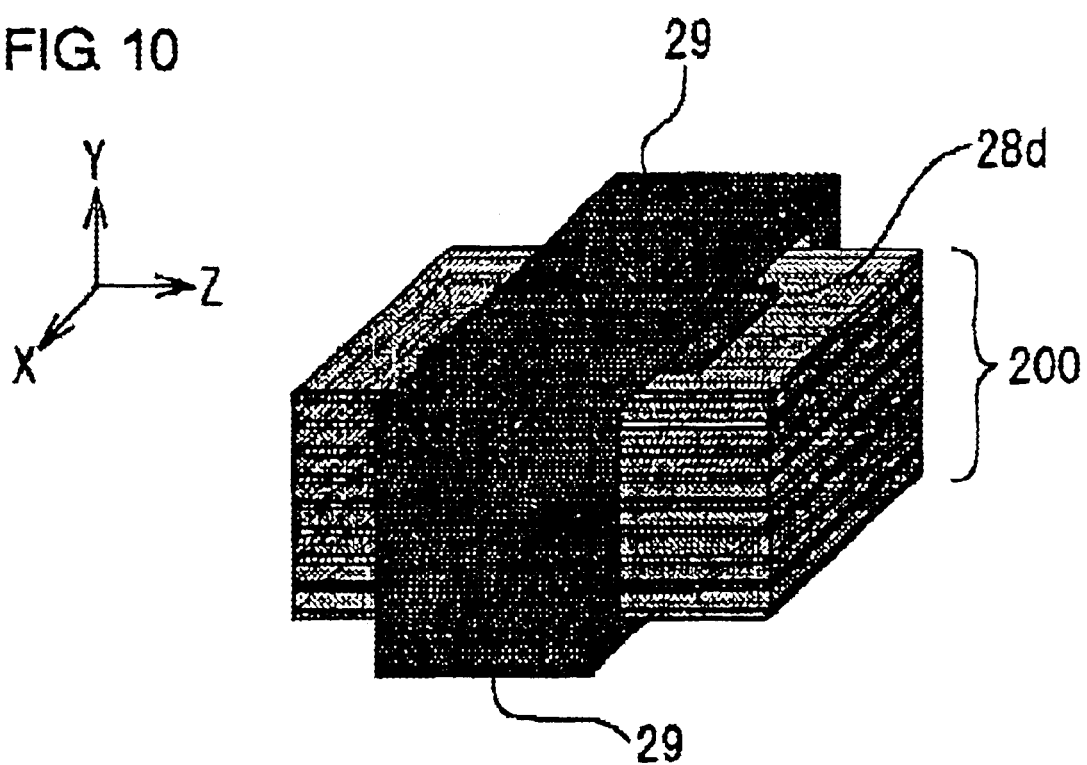

(First Embodiment of Refraction Means)

(Without Refraction Means)

Second Embodiment of Refraction Means

Without Refraction Means

Third Embodiment of Refraction Means

Fourth Embodiment of Refraction Means

Fifth Embodiment of Refraction Means

Third Embodiment of Refraction Means

Fourth Embodiment of Refraction Means

Fifth Embodiment of Refraction Means

US 6,819,861 B2

LAMINATED OPTICAL WAVEGUIDE ARRAY, BEAM COLLECTING DEVICE AND LASER EMISSION DEVICE

INCORPORATION BY REFERENCE

This application is based on and claims priority under 35 U.S.C. sotn. 119 with respect to Japanese Applications No. 2002-188487 filed on Jun. 27, 2002 and No. 2002-221596 filed on Jul. 30, 2002, the entire contents of which are incorporated herein by reference.

BACKGROUND OF THE INVENTION

1. Field of the Invention

The present invention relates to a laminated optical waveguide array, a beam collecting device and a laser emission device for collecting laser beams to a target position on an article to be processed.

2. Discussion of the Related Art

FIG. 16 shows a general construction of a semiconductor laser beam collecting device known as prior art. The semiconductor laser beam (hereafter referred simply as "laser beam") 2 is emitted from a beam emitting part 12 on an active layer of a semiconductor laser (such as a laser diode or the like) and takes the form of an elliptical in the section normal to the direction in which the laser beam 2 travels. The laser beam 2 of the elliptical form has a fast axis direction and a slow axis direction. The longer the elliptical form is distanced from the beam emitting part 12, the larger it becomes. There has been known a semiconductor laser beam collecting device of the type wherein laser beams emitted from a plurality of beam emitting parts which are arranged in a second-order matrix extending in the fast axis direction and in the slow axis direction are collected by optical fibers of a fewer number to reinforce the output of the laser beams.

For example, where the semiconductor lasers are to be employed as a power source for a laser machining apparatus or a laser material processing apparatus, it must be of a high power. The laser beam emitted from a single beam emitting part is weak in power strength. Thus, a group of lenses are used to collect laser beams emitted from a plurality of beam emitting parts thereby to strengthen the output of the laser beams.

Japanese unexamined, published patent application No. 2000-98191 discloses a semiconductor laser beam collecting device shown in FIG. 16. In the application, it is proposed to collect laser beams to optical fibers thereby to strengthen the beam output power by utilizing a group of lenses and the optical fibers 30 and arranging a fast axis direction collimation lens array 70, a fast axis direction collective lens 80 and a slow axis direction collective lens 90, in turn within a very short space from the beam emitting parts 12 to the optical fibers 30.

In order that laser beams emitted from semiconductor laser emitting parts are collected efficiently to optical fibers thereby to strengthen the output power of the laser beams, it is necessary to gain the density of the beams by entering the beams from many numbers of the emitting parts into much finer optical fibers and to enter the beams efficiently into the optical fibers by entering the beams into the incidence surfaces or surfaces of the optical fibers at a smaller or gentle incident angle, namely, at an angle as close as the right angle to the incidence surfaces without reflecting the entered laser beams outside.

The laser beams coming from the emitting parts 12 advance as they spread in the fast axis direction as well as in the slow axis direction. For collection of the laser beams which advance as spreading, the lenses used therein and the arrangement of the same are to be quite highly precise.

In the semiconductor laser collecting device known heretofore (e.g., from the aforementioned Japanese patent application No. 2000-981919), the emitting parts are arranged with a relatively wide space in the fast axis direction, and correcting the beams in that direction is carried out with the fast axis direction collecting lens 80 once they are transformed with the fast axis direction collimation lens array 70 into parallel beams. On the other hand, the emitting parts 12 are arranged with a relatively narrow space in the slow axis direction, which requires that the lenses used be very small in diameter and difficult to arrange. Thus, collecting the beams in the slow axis direction is carried out with the slow axis direction collecting lens array 90 without transforming the beams into those parallel.

That is, in the prior art device mentioned above, the space between the slow axis beam collective lens array 90 and the emitting parts 12 is short, e.g., several millimeters at most. It is therefore difficult to arrange the fast axis direction collimation lens array 70 and the slow axis direction beam collective lens array 90 properly within the short space. The optical fibers 30 are caused to be arranged within a short distance from the emitting parts 12. Thus, where the incident angle ($\theta_{outx}$) in the fast axis direction is set small, the number of the laser beams which can be collected in the fast axis direction is made small, so that it cannot be practiced to obtain high power laser beams from a large number of optical fibers for use in laser machining.

SUMMARY OF THE INVENTION

It is therefore a primary object of the present invention to provide a laminated optical waveguide array, a beam collecting device and a laser emission device capable of collecting many numbers of laser beams for a higher power output.

Another object of the present invention is to provide a laminated optical waveguide array, a beam collecting device and a laser emission device capable of restraining laser beams from shining therethrough thereby to enhance the laser collecting efficiency.

Briefly, according to the present invention, there is provided a laminated optical waveguide array comprising: a plurality of plate-like optical waveguides made of a material having a predetermined refractive index; and a plurality of spacer members having a lower refractive index than that of the optical waveguides and arranged alternately with the optical waveguides.

With this configuration, a spacer member is interposed between two adjoining optical waveguides, so that the dimension in the space between the adjoining optical waveguides can be set precisely and easily. In particular, since the spacer members are made of a material having a lower refractive index than that of the optical waveguides, the laser beams traveling within the optical waveguides is restrained from coming therethrough, so that th beam collecting efficiency can be enhanced. Preferably, optical fibers may be utilized as the spacer means as described in one form of the embodiments. Since optical fibers in the market have various outer diameters machined precisely and are easily available. Therefore, by selecting the optical fibers properly, the spacer members for the optical waveguides can be made easily and at a lower cost. Spacer balls and plate members may be utilized as the spacer member as described in other forms of the embodiments.

In another aspect of the present invention, there is provided a laser emission device comprising: a semiconductor laser array having a plurality of laser emitting parts which are arranged in a fast axis direction as well as in a slow axis direction each for emitting a laser beam of an elliptical cross-section which spreads in the fast and slow axis directions as it travels; a plurality of optical fibers; a collective lens; and a laminated optical waveguide array composed of a plurality of plate-like optical waveguides made of a material having a predetermined refractive index and a plurality of spacer members having a lower refractive index than that of the optical waveguides and arranged alternately with the optical waveguides. The waveguide array is arranged between the semiconductor laser array and the plurality of optical fibers for collecting laser beams emitted from plural laser emitting parts of a group separated from other groups in the slow axis direction, to one of the optical fibers aligned thereto. The collective lens further collects the collected laser beams from all of the optical fibers and concentrates them to a target position.

With this configuration, a plurality of laser beams emitted from the semiconductor laser array are collected separately by plural optical wave guides, and the laser beams collected by each optical waveguide is further collected through the optical fiber to the collective lens, so that laser beams collected in a high density can be concentrated onto the target position.

In still another aspect of the present invention, there is provided a beam collecting device comprising: an optical waveguide for collecting a beam entered into an incidence surface thereof to a predetermined position in a predetermined direction and for emitting the a beam from an emission surface of an optical fiber; and refraction means provided between the optical waveguide and the optical fiber for diminishing the angle which the beam refracted at the incidence surface of the optical fiber makes with the axis of the optical fiber, in comparison with the angle which the beam before being refracted at the emission surface of the optical waveguide makes with the axis of the optical fiber.

With this configuration, the refraction means diminishes an acute or larger angle of a laser beam relative to the lengthwise direction or the axis of the optical fiber so that the laser beam is entered into the optical fiber at a gentle or smaller angle. Thus, a larger number of laser beams can be collected by the optical waveguide in a miniaturized system, but the incident angles of the collected laser beams to the incidence surface of the optical fiber are diminished or reduced. This advantageously restrains the laser beams traveling within the optical fiber from coming through the same, so that not only the miniaturization of the system can be realized, but also the beam collecting efficiency can be enhanced.

BRIEF DESCRIPTION OF THE ACCOMPANYING DRAWINGS

The foregoing and other objects and many of the attendant advantages of the present invention may readily be appreciated as the same becomes better understood by reference to the preferred embodiments of the present invention when considered in connection with the accompanying drawings, wherein like reference numerals designate the same or corresponding parts throughout several views, and in which.

Figure 4:
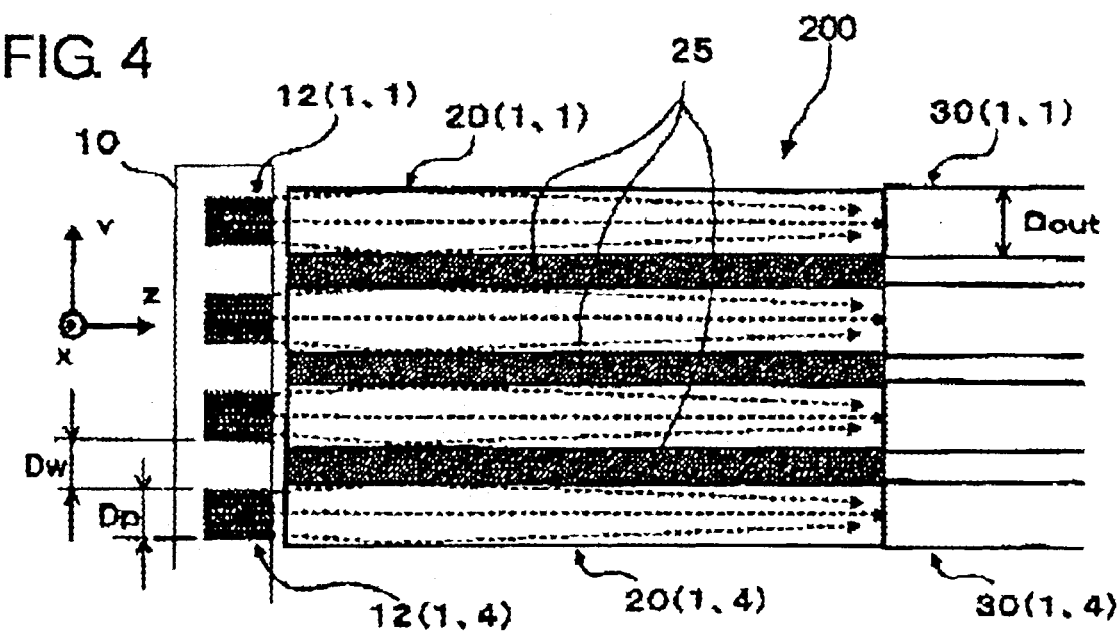
Figure 6A:
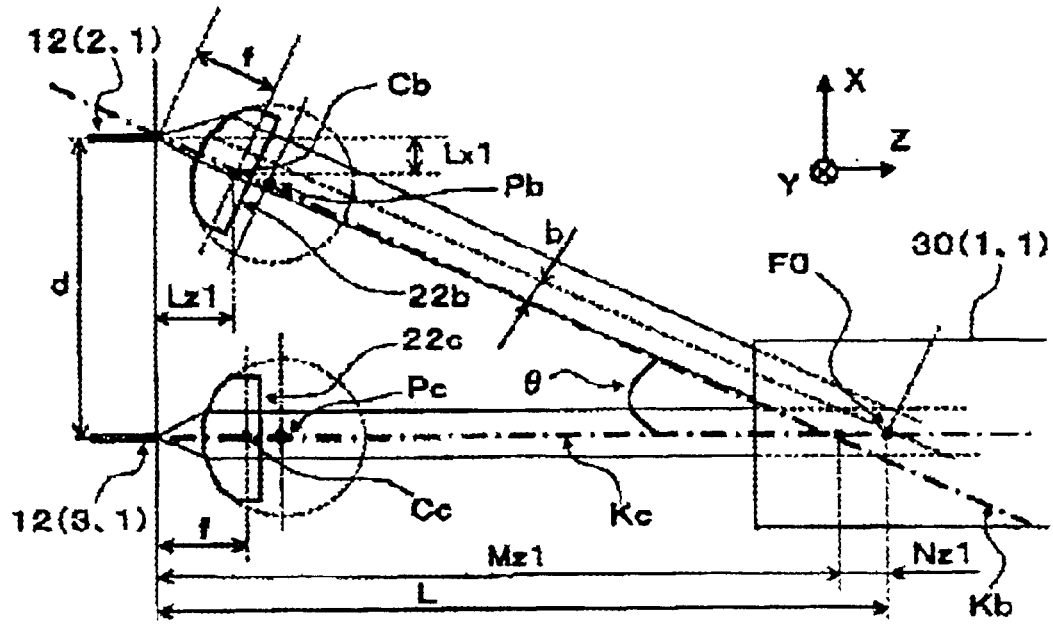
Figure 6B:
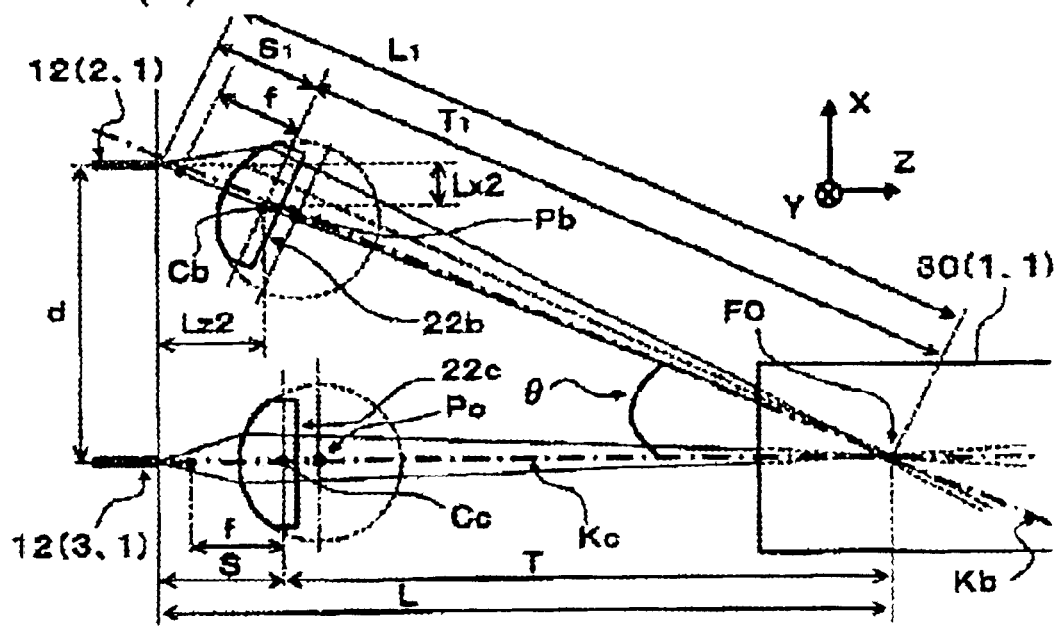
Figure 7A:
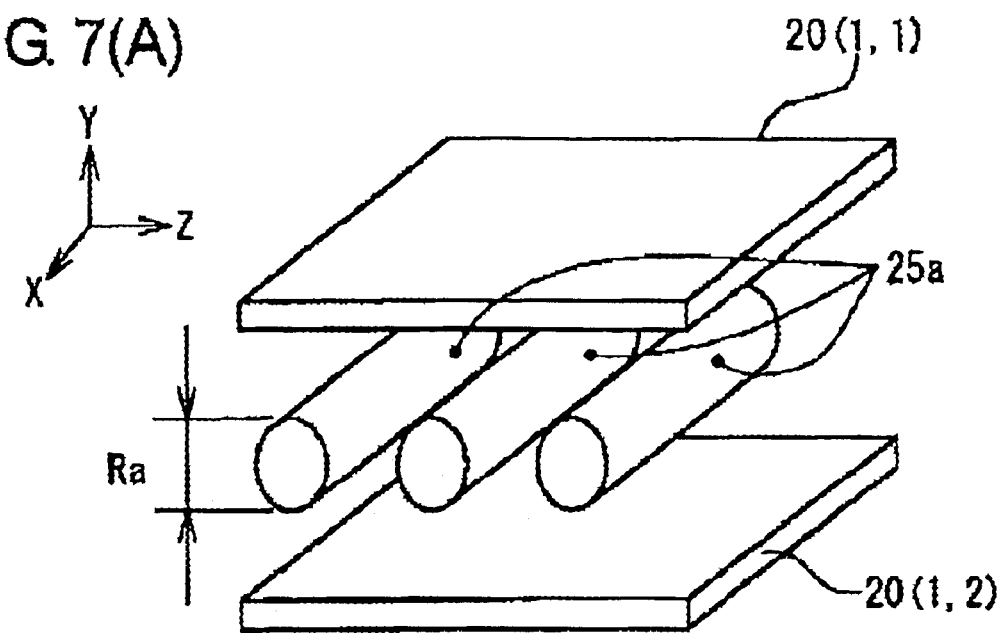
Figure 7B:
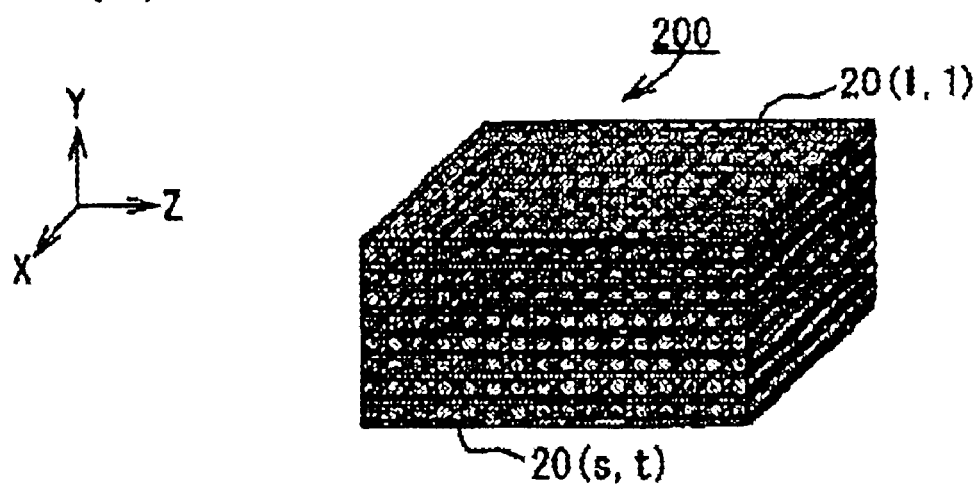
Figure 8A:
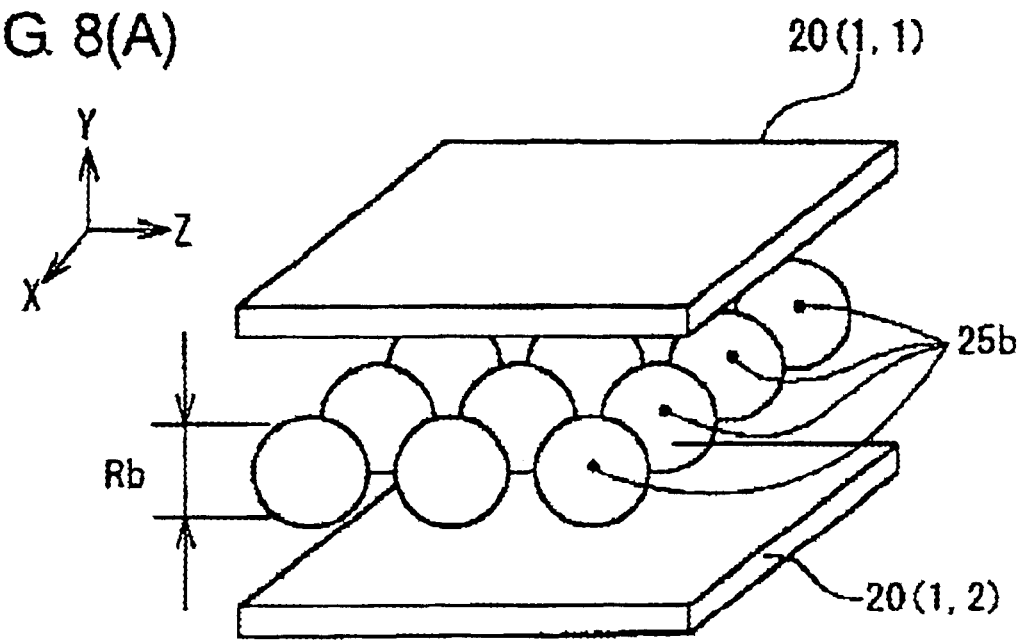
Figure 8B:
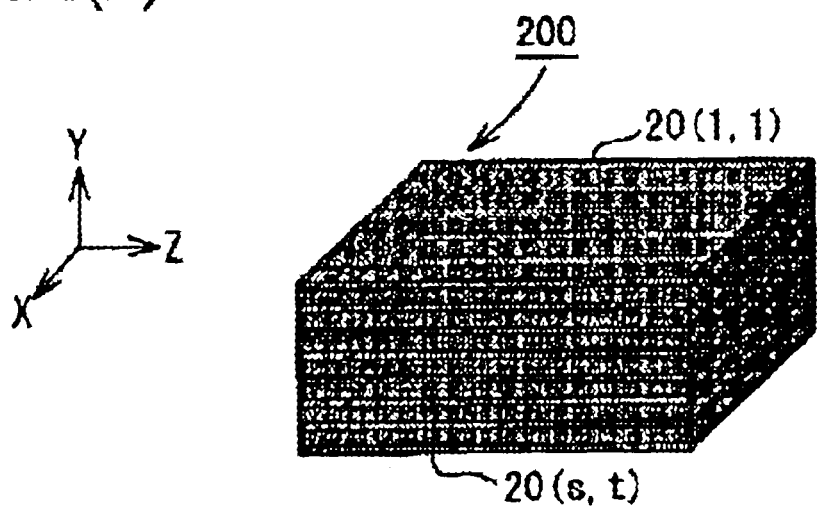
Figure 9A:
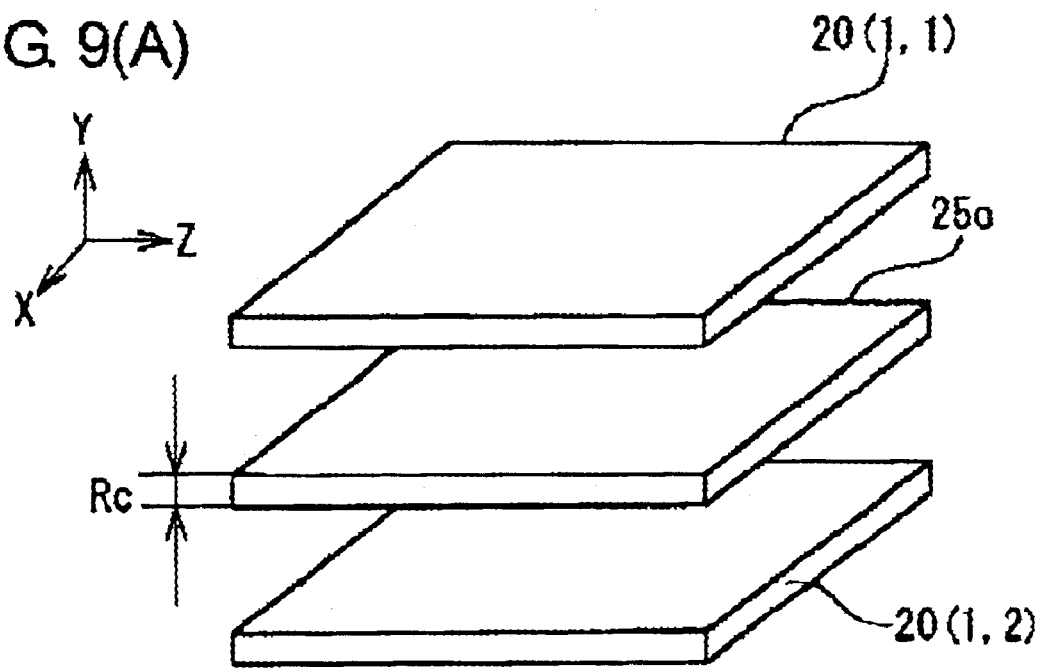
Figure 9B:
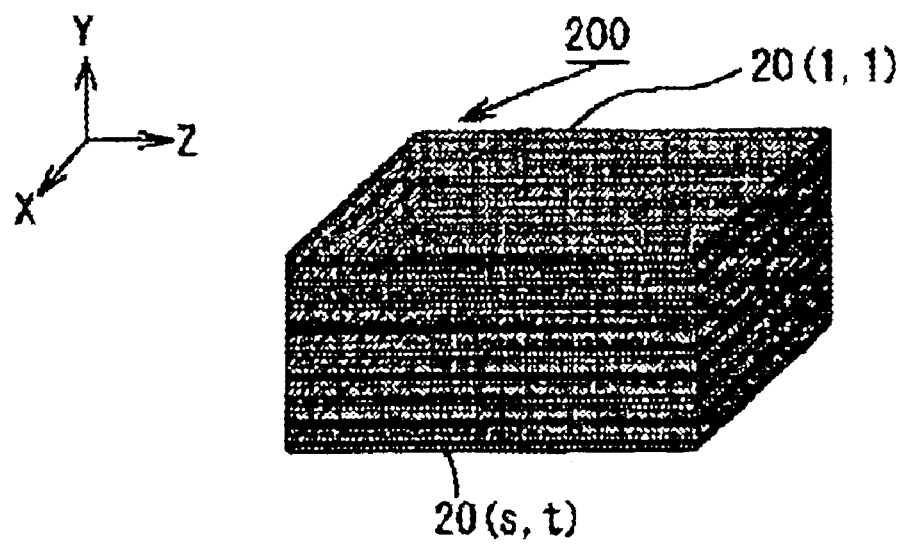
Figure 11A:
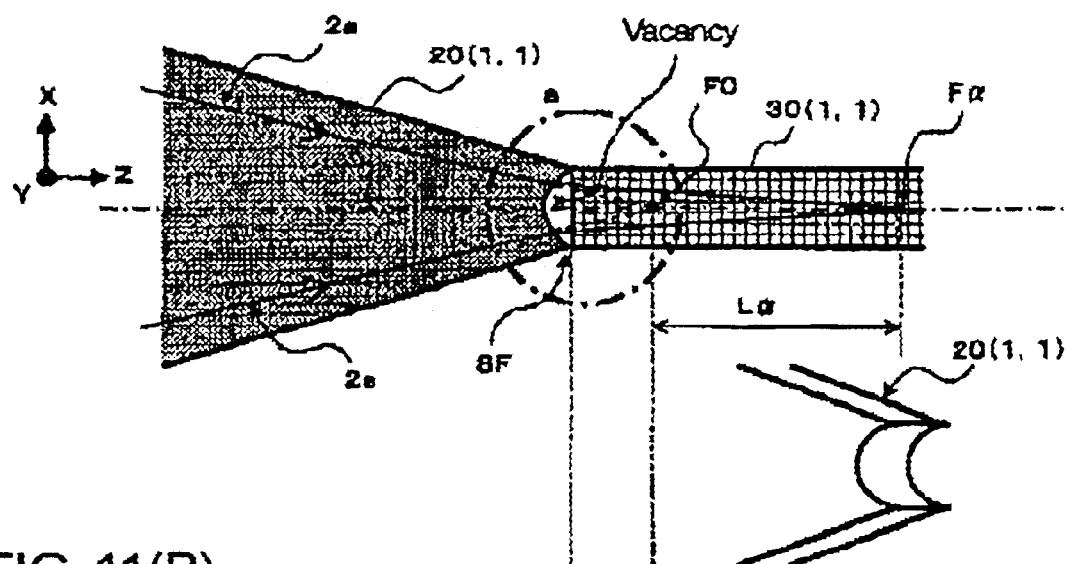
Figure 11B:
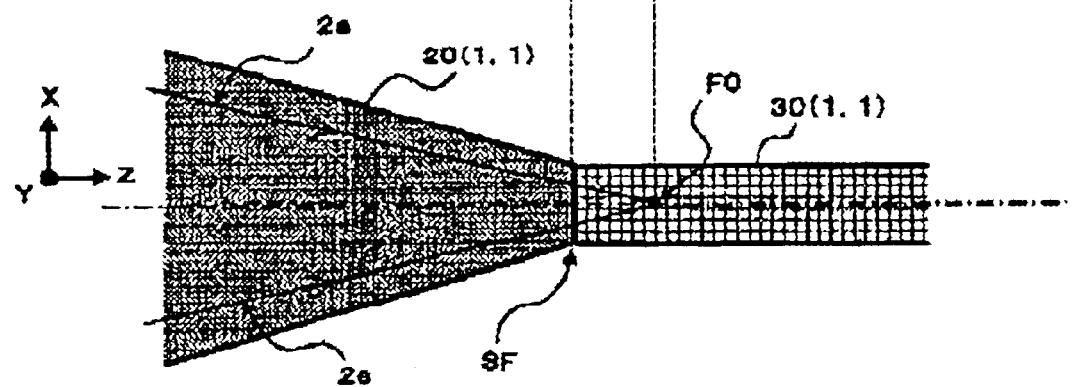
Figure 12A:
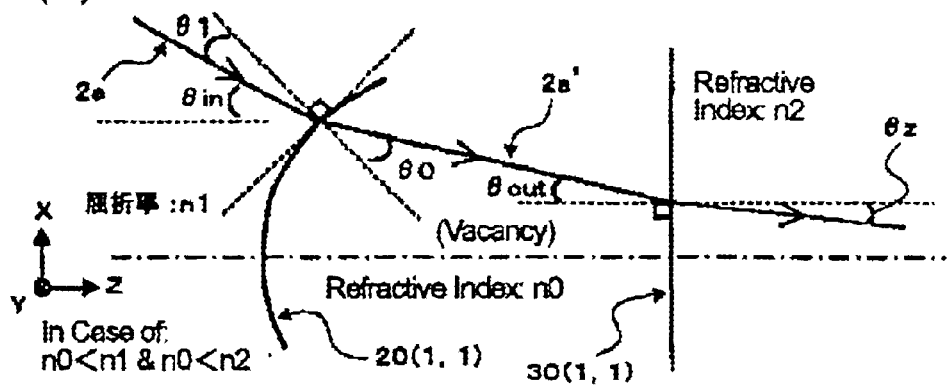
Figure 12B:
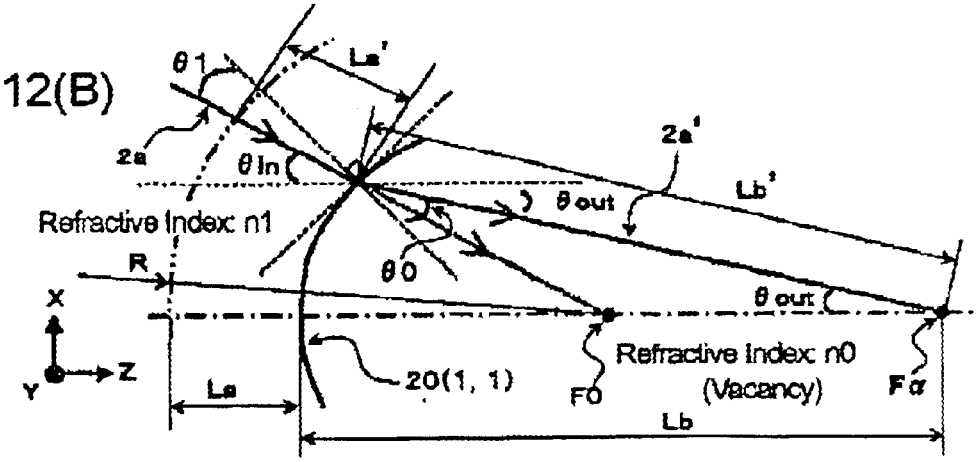
Figure 12C:
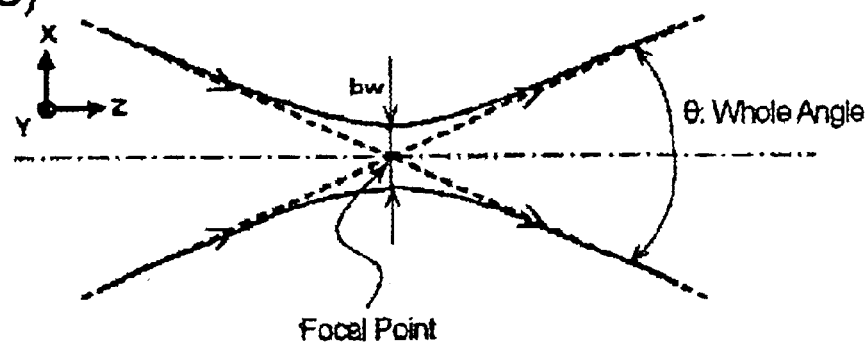
Figure 13A:
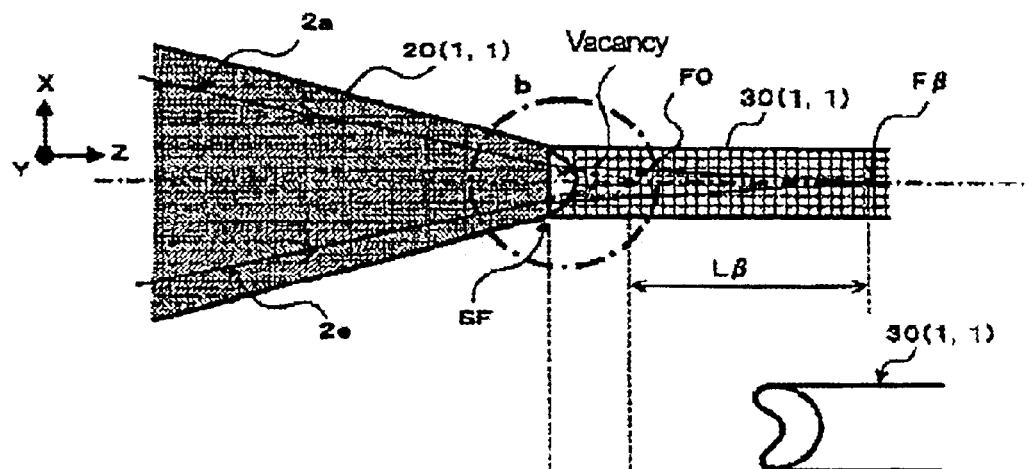
Figure 13B:
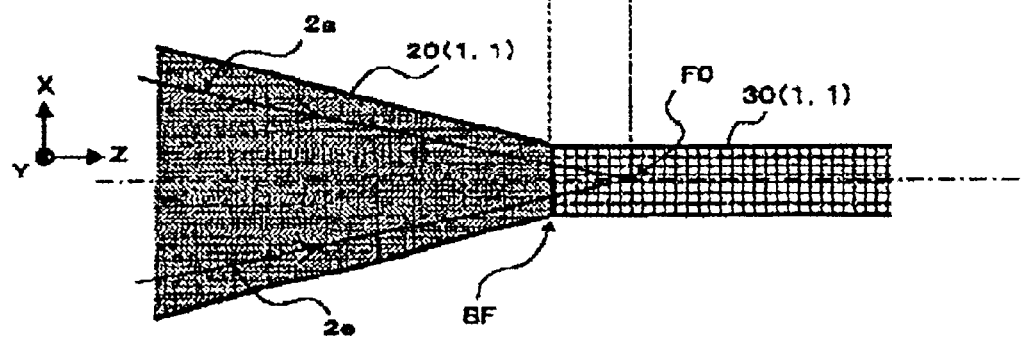
Figure 13C:
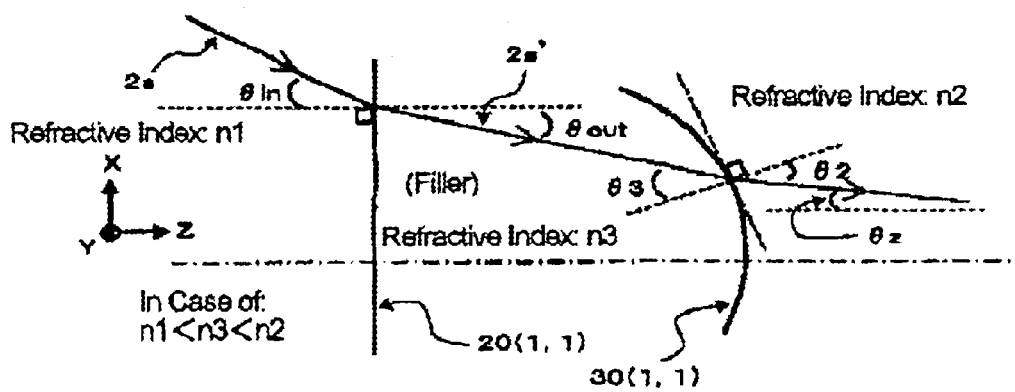
Figure 14A:
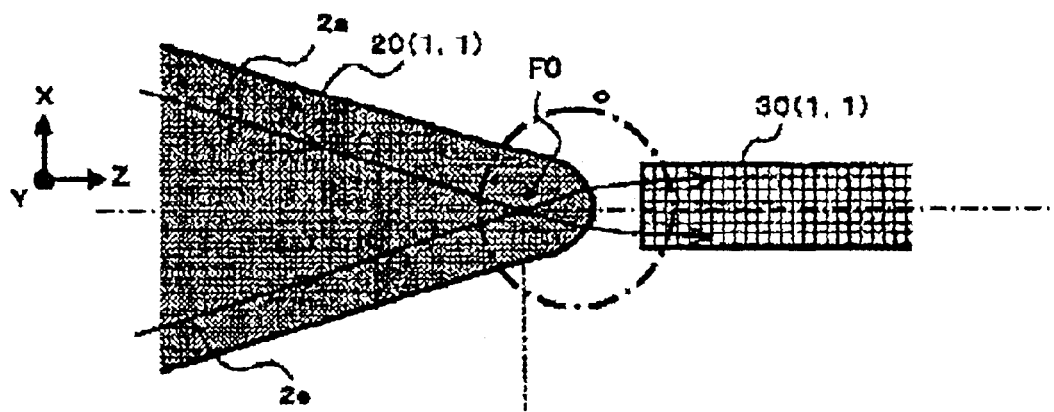
Figure 14B:
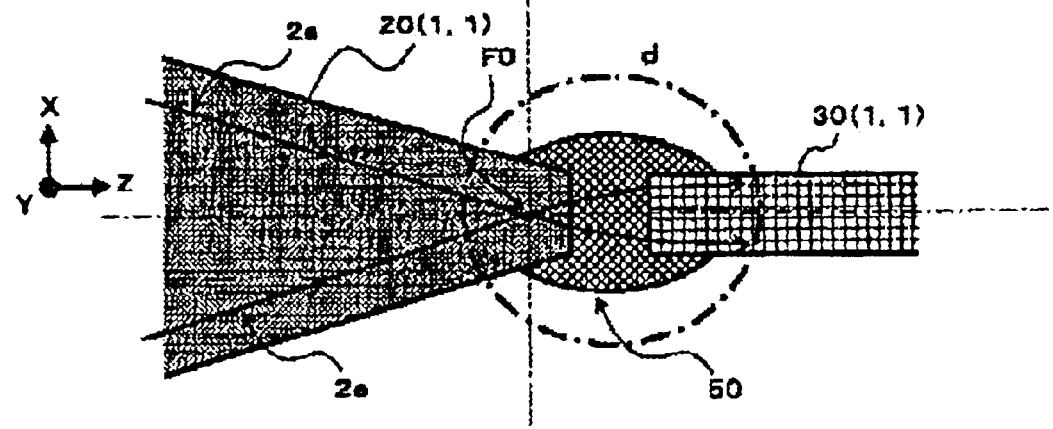
Figure 14C:
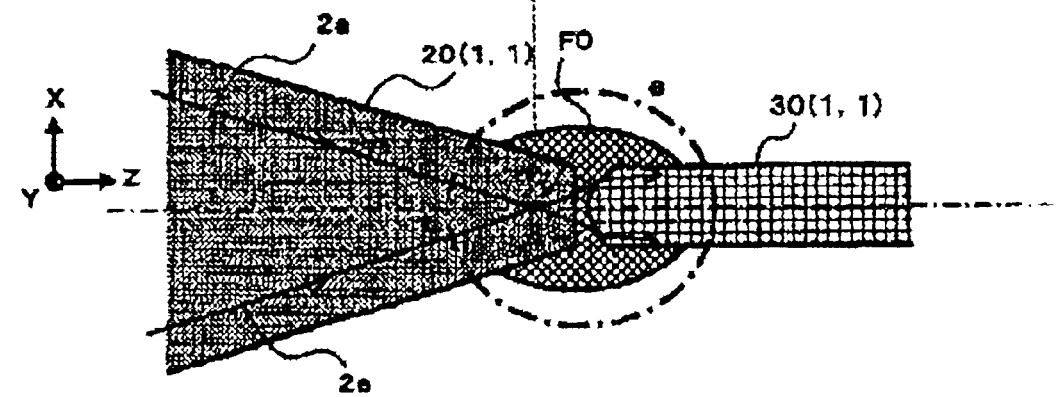
Figure 15A:
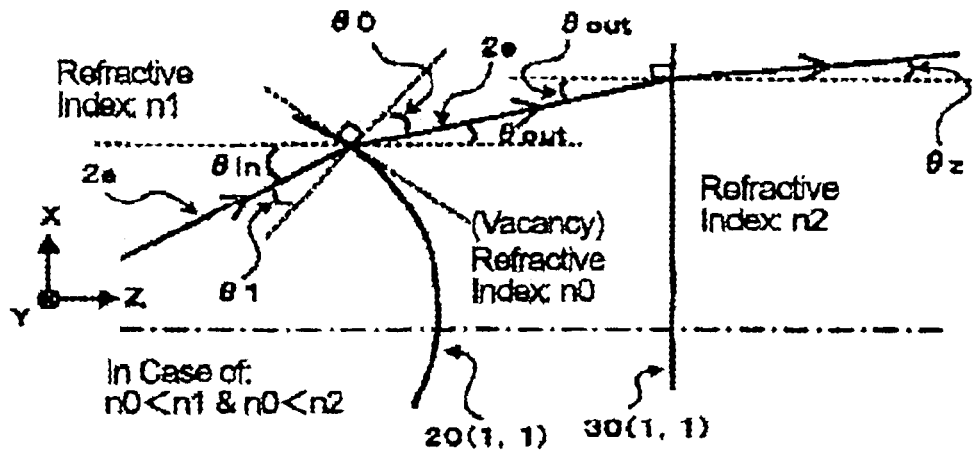
Figure 15B:
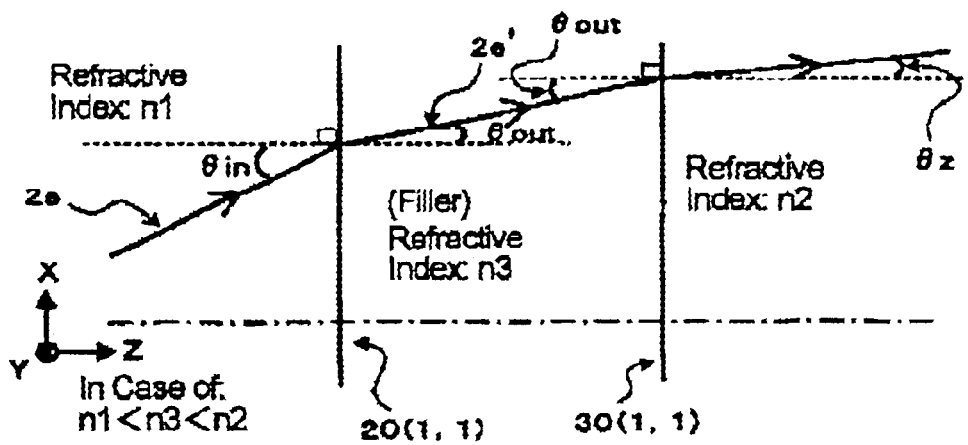
Figure 15C:
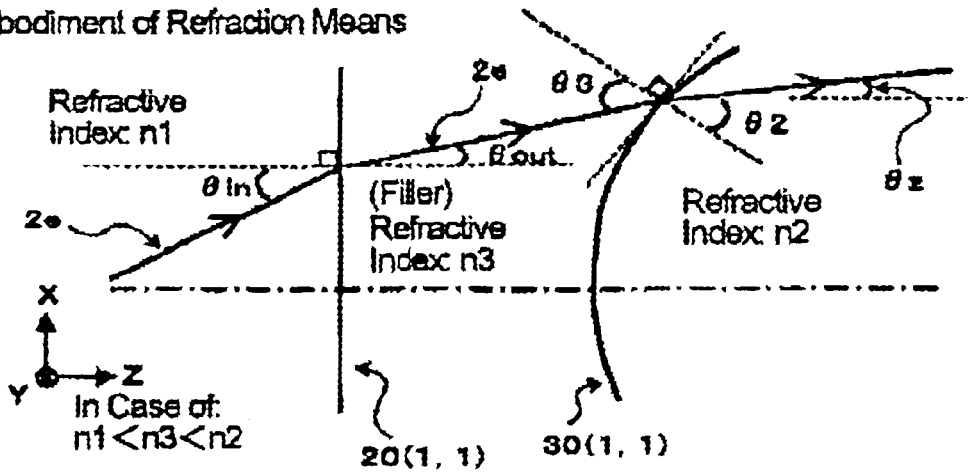
Figure 16:
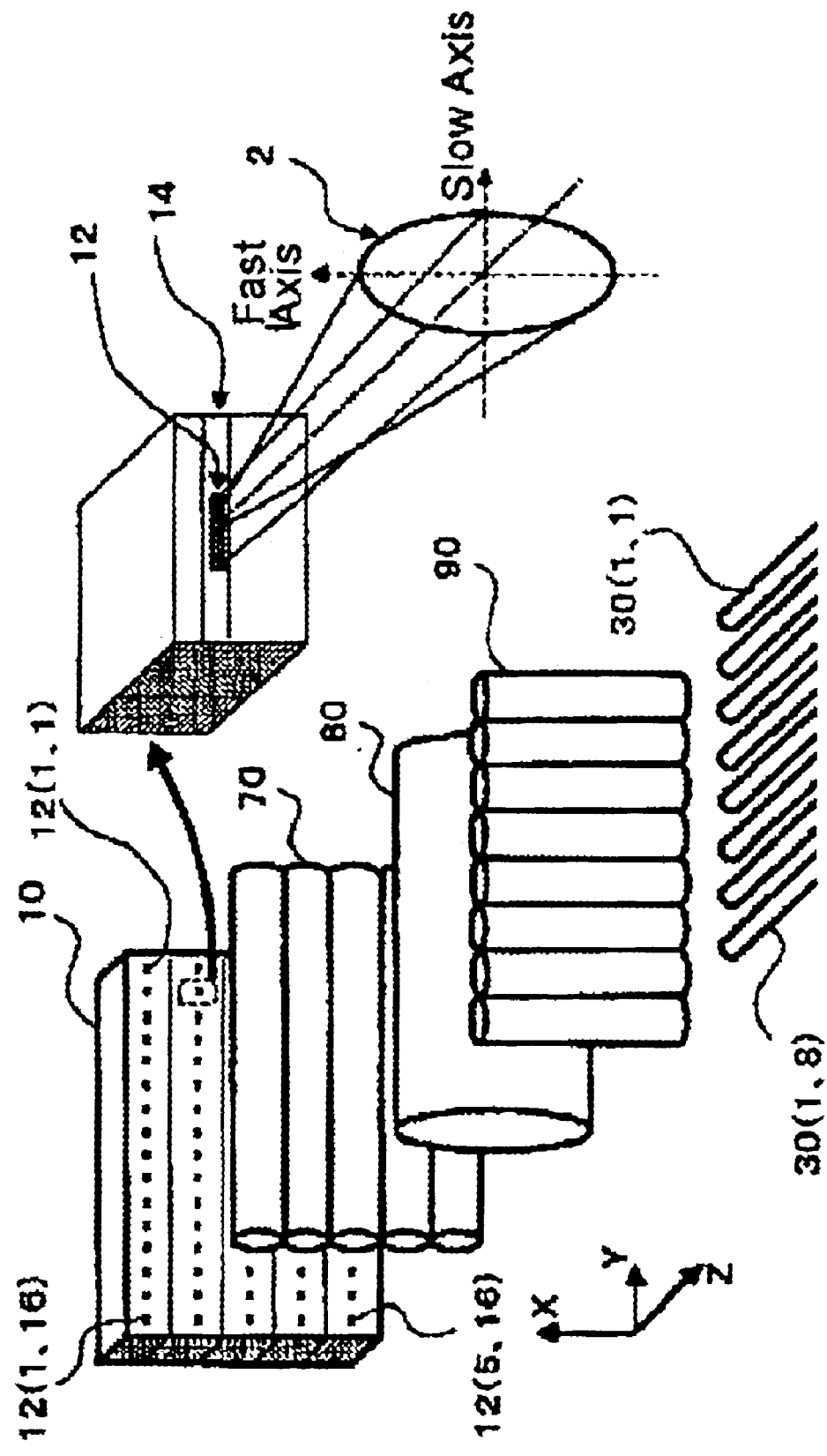
Figure 17A:
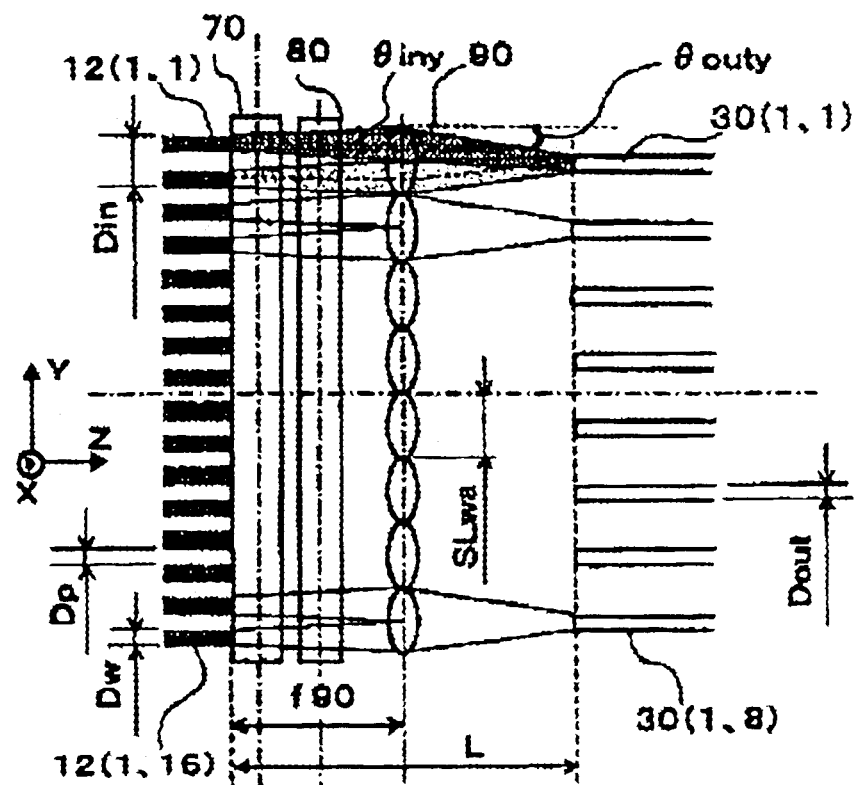
Figure 17B:
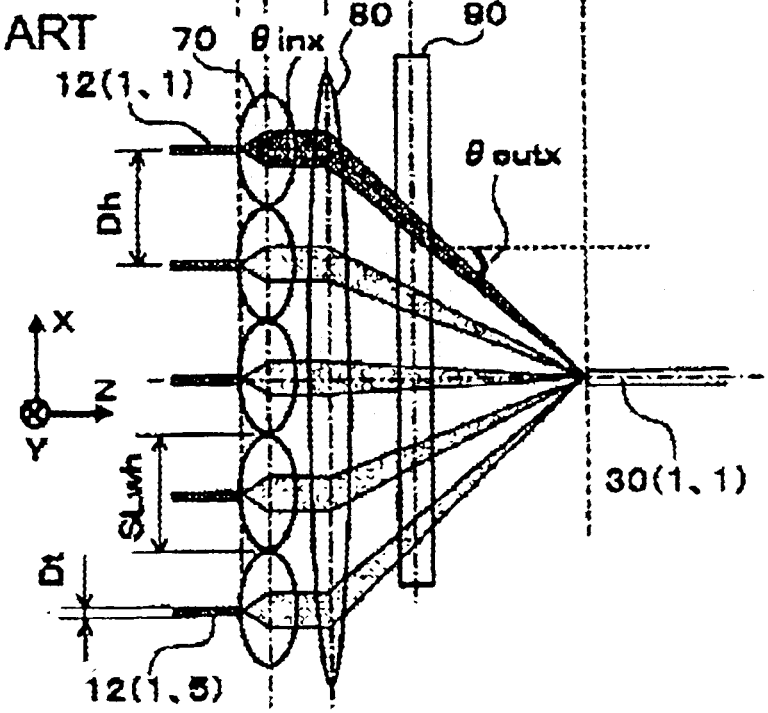

FIGS. 3(A) and 3(B) are explanatory views for explaining the positions in arrangement of laser beam emitting parts 12, a laminated optical waveguide array 200 and optical fibers 30 and the state of laser beams being collected to the optical fibers;

FIG. 4 is an explanatory view showing the general configuration of the laminated optical waveguide array 200;

FIGS. 5(A)–5(D) are explanatory views showing the state that the laser beams emitted from the optical fibers are collected through the collective lens 100 to a predetermined position;

FIGS. 6(A) and 6(B) are explanatory views showing the configurations and arrangements of first lenses in the laminated optical waveguide array 200;

FIGS. 7(A) and 7(B) are explanatory views showing the first embodiment of the laminated optical waveguide array 200 according to the present invention;

FIGS. 8(A) and 8(B) are explanatory views showing the second embodiment of the laminated optical waveguide array 200;

FIGS. 9(A) and 9(B) are explanatory views showing the third embodiment of the laminated optical waveguide array 200;

FIG. 10 is an explanatory view showing an example of the way of securing the laminated optical waveguide array 200;

FIGS. 11(A) and 11(B) are enlarged fragmentary views showing the state of laser beams being refracted in the first embodiment of refraction means for restraining the laser beams from shining through an optical fiber and also showing the same state in a conventional device which is not provided with the refraction means;

FIGS. 12(A)–12(C) are enlarged views of a part "a" in FIG. 11(A), respectively showing in detail the state of the laser beams being refracted, the way of calculating a concave curved surface formed at an emission surface of each optical waveguide 20, and the beam parameter product;

FIGS. 13(A)–13(C) are enlarged fragmentary views respectively showing the state of laser beams being refracted in the second embodiment of the refraction means and the same state in the conventional device which is not provided with the refraction means, further including an enlarged view of a part "b" in FIG. 13(A) showing in detail the state of a laser beam being refracted in FIG. 13(A);

FIGS. 14(A), 14(B) and 14(C) are enlarged fragmentary views respectively showing the states of laser beams being refracted in the third, fourth and fifth embodiments of the refraction means;

FIGS. 15(A), 15(B) and 15(C) are enlarged views of parts "c", "d" and "e" in FIGS. 14(A), 14(B) and 14(C), respectively showing the states of laser beams being refracted in the parts "c", "d" and "e";

FIG. 16 is a perspective view showing the general configuration of a semiconductor laser collecting device in the prior art; and FIGS. 17(A) and 17(B) are explanatory views showing the positions in arrangement of respective lenses and the states of laser beams being corrected through the lenses as viewed respectively in fast and slow axis directions in the prior art device shown in FIG. 16.

DETAILED DESCRIPTION OF THE PREFERRED EMBODIMENTS

The embodiments of the present invention will be described in detail with reference to the accompanying drawings.

Figure 1:
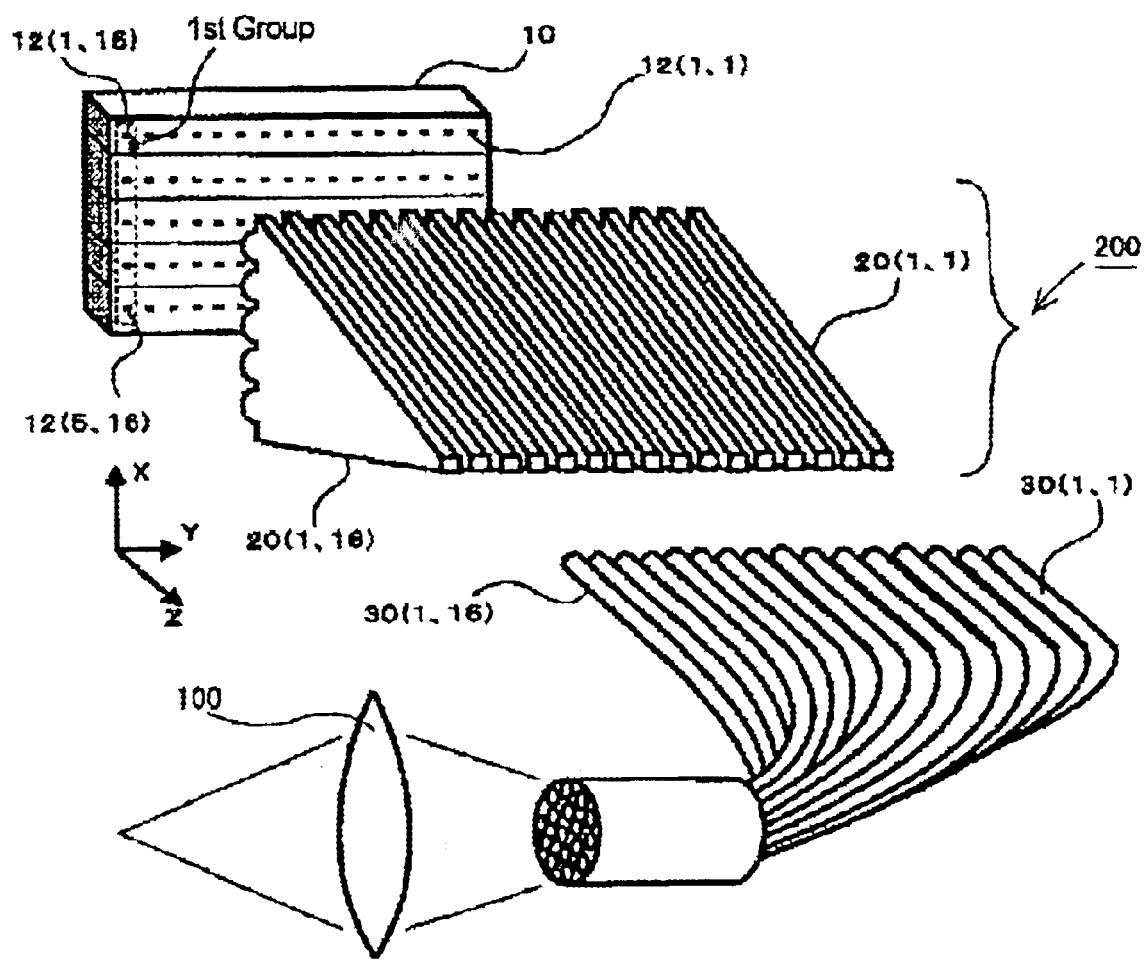
FIG. 1 is a perspective view showing the embodiment of a beam collecting device and a laser emission device according to the present invention.

FIG. 1 shows the general configuration of a laser beam collecting device and a laser beam emission device in the embodiment. In the embodiment shown in FIG. 1, the distance between a semiconductor laser array 10 and optical fibers 30 can be made longer than the corresponding distance in the prior art laser beam collecting device shown in FIG. 16. More specifically, compared to the distance of about 3.2 mm in the prior art, the distance in the embodiment can be set several centimeters (cm) or much longer, to be more exact, up to about 20 cm in this particular embodiment, in dependence upon the length of an optical wave guide assembly or array 200. Thus, the incident angle of the beams into the optical fibers 30 can be set smaller, so that collecting the laser beams can be carried out more efficiently.

Further, the device shown in FIG. 1 omits a fast axis direction collimation lens array 70, a fast axis direction collective lens 80 and a slow axis direction collective lens array 90 which are used in the prior art laser beam collecting device shown in FIG. 16 and instead, uses an optical waveguide array 200. Therefore, the device of the embodiment shown in FIG. 1 is not only simplified in construction, but also made very easy to make adjustment in assembling (fine adjustment of the positions of lenses or the like) in comparison to the prior art laser beam collecting device.

(General Construction)

In the embodiment shown in FIG. 1, a plurality of beam emitting parts 12(m, n) at m-lines and n-columns are divided into plural first groups each group including those aligned in the fast axis direction. Laser beams emitted from each first group are collected into one or more optical waveguides 20(s, t) in the same plane extending in the fast axis direction and then are entered into one or more optical fibers 30(s, t) also in the same plane therewith. In this particular embodiment, the laser beam array 10 has eighty (5×16) beam emitting parts, and sixteen (1×16) optical waveguides and sixteen optical fibers (1×16) are arranged, so that five laser beams on each column are collected to one optical waveguide in the same plane with the column and are entered into one optical fiber also in the same plane therewith.

The semiconductor laser array 10 has a plurality of beam emitting parts 12 and is constituted by arranging in a two-dimensional space semiconductor lasers each with a single emitting part, or stacking in a row semiconductor lasers of an array type having plural emitting parts, or using a semiconductor laser stack on which a plurality of beam emitting parts are arranged in a two-dimensional manner. For the array 10, a semiconductor laser stack is employed in this particular embodiment.

The optical waveguide array 200 is composed of a plurality of optical waveguides 20 arranged in the slow axis direction in correspondence respectively to the plural first groups or columns of the laser emitting parts 12 m, n) divided in the slow axis direction. The laser beams entered into each optical waveguide 20 advances within the same as they reflect almost fully, as will be described later in detail.

The optical waveguide array 200 collects (more precisely, bundles or condenses) a plurality of laser beams entered from the beam emitting parts 12 of the semiconductor laser array 10, in the fast axis direction so that the laser beams emitted from each column are gathered to each optical fiber in the same plane with the column.

Herein, term "bundle" means collecting plural laser beams without effecting the substantial shrinkage in diameter of each beam, and term "condense" means shrinking the diameters of laser beams or collecting laser beams while shrinking the diameter. Also, term "collect" means reinforcing or strengthening the power of laser beams by way of "bundling" or "condensing" the beams.

The laser beams collected at least in the fast axis direction are entered from the emission surface of each optical waveguide 20 into the incidence surface of each optical fiber 30. Then, a collective lens 100 collects the laser beams, output from the emission surfaces of the optical fibers 30 bundled into a desired shape, to a predetermined or desired target position. Accordingly, the laser beams emitted from the plural emitting parts 12 of the semiconductor laser array 10 are collected to the target position, and the output power of the collected beams is strengthened for use in machining or the like.

(General Configuration of Optical Waveguide)

Next, the general configuration of the optical waveguides 20 will be described with reference to FIG. 2. Each of the optical waveguides 20 is constituted being formed at an incidence surface thereof with, as beam collecting means, a plurality of cylindrical lens 22a–22e (first lenses) whose center axes extends in the slow axis direction and which are spaced at regular interval in the fast axis direction.

Figure 2:
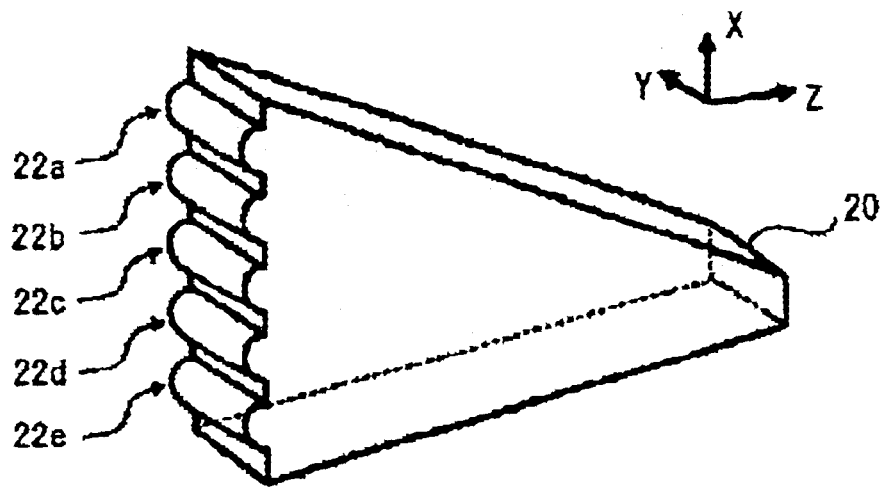
FIG. 2 is a perspective view showing the general configuration of an optical waveguide constituting a part of a laminated optical waveguide array according to the present invention.

In the waveguide exemplified in FIG. 2, a surface where the first lenses 22a–22e are arranged is taken as an incidence surface for laser beams to enter, while another surface opposite to the incidence surface is taken as an emission surface for the laser beams to be emitted therefrom. In order that the laser beams are collected to be output from the emission surface, the size of the emission surface is made smaller in the fast axis direction (X-axis direction) than that of the incidence surface. Namely, the waveguide takes the form of a taper as viewed from a lateral side thereof. The waveguide 20 in this particular embodiment has the incidence and emission surfaces whose sizes in the slow axis direction (Y-axis direction) are the same. However, the waveguide 20 may be modified to have the emission surface whose size in the slow axis direction is smaller than the incidence surface. Where the first lenses 22a–22e are constituted properly, the waveguide 20, without being tapered in the traveling direction (Z-axis direction) of the laser beams, is enabled to collect the laser beams in the fast axis direction. The waveguide 20 may be made of various kinds of materials such as, for example, glass or the like.

(Arrangement of Components and State of Laser Beams Being Collected)

Next, description will be made with reference to FIGS. 3(A) and 3(B) as to the arrangement of the emitting parts 12, the optical waveguide array 200, and the optical fibers 30 and as to the state of laser beams being collected to the optical fibers 30. FIG. 3(A) is illustrative of the components as viewed in the fast axis direction. The laser beams output from each first group of the emitting parts 12 are entered into a corresponding one of the optical waveguides 20 in the same plane extending in the fast axis direction and travel without passing outside the corresponding waveguide 20 while repetitively reflecting within the same. The beams then reach the emission surface of the waveguide 20 and enter the incidence surface a corresponding one of the optical fibers 30.

FIG. 3(B) is illustrative of those as viewed in the slow axis direction, depicting the state in which the laser beams are being refracted and collected in the fast axis direction. In FIG. 3(B), the focal length of th first lenses 22a–22e of the waveguides 20 is taken as "f".

The optical waveguides 20(s, t) are located to be aligned respectively with the first groups of the emitting parts in the Z-axis direction perpendicular to the X and Y-axes. Each of the optical waveguides 20(s, t) is also located at such a position in the Z-axis direction that the focal points of the first lenses 22a–22e thereof coincide with the emitting parts 12 of a corresponding first group, namely, that the first lenses 22a–22e are spaced by the focal length "f" from the emitting parts 12 of the corresponding first group. With the waveguides 20 so located, the laser beams passing through the waveguides 20 are uniformed in the widths thereof and are collected (bundled in this case) as indicated at 2a in FIG. 3(B).

As indicated at 2c–2e in FIG. 3(B), each of the optical waveguides 20(s, t) may be located with the first lenses 22a–22e being located at such a position S6 a littler farther away than the focal length "f" from the emitting parts 12 of the corresponding first group. The parameters S6 and T6 may be determined so that the equation (1/S6+1/T6=1f) holds, and the optical fibers 30(s, t) may be located with the incidence surfaces thereof being at a distance (S6+T6) from the emitting parts 12. In this modified arrangement, the laser beams passing through the waveguides 20(s, t) are collect d (condensed in this case) as indicated at 2c–2e in FIG. 3(B).

(General Configuration of Laminated Optical Waveguide Array)

A laminated optical waveguide assembly or array which is constituted by integrally making up those waveguides 20 shown in FIG. 3(A) will be described with reference to FIG. 4. FIG. 4 illustrates the array 200 as viewed in the fast axis direction, and for better understanding, the array 200 is depicted in a dimension different from that in FIG. 3(A).

In the array 200 shown in FIG. 4, the dimension in the slow axis direction of each optical waveguide 20(s, t) is made almost the same as that of each beam emitting part 12(m, n). Thus, the laser beam output from any one of the emitting parts 12(m, n) is properly entered into a corresponding one of the optical waveguides 20(s, t), wherein no interference occurs between the laser beams traveling within one waveguide and those traveling within the next thereto in the slow axis direction.

Further, a spacer member 25 of a thin plate having a smaller refractive index than that of the waveguides 20(s, t) is interposed between any two adjacent or adjoining waveguides 20(s, t). The waveguides 20(s, t) and the spacer members 25 arranged in the slow axis direction are united bodily to constitute the optical waveguide array 200. This advantageously makes the dimension of the laminated optical waveguide array 200 large in the slow axis direction, so that supporting the array 200 in machining the first lenses 22a–22e can be eased thereby to make the machining easier. With the waveguide array 200 so assembled, the same can be arranged as a laser beam collecting device at a predetermined position, and the fine adjustment of the locations of the waveguides can be done as a unit without laborious independent adjustments needed one by one for the respective waveguides, whereby the adjustment of the waveguide array can be done conveniently.

(Collection of Laser Beams Output from Optical Fibers)

Next, description will be made with reference to FIGS. 5(A) and 5(B) as to the state that the laser beams emitted from the optical fibers 30(s, t) in FIG. 1 are collected by a collective lens 100 to a predetermined or desired target position SM shown in FIG. 5.

The optical fibers 30(s, t) are bundled to make the emission surfaces thereof represent a desired shape such as shown in FIGS. 5(C) and 5(D). By forming the emission surfaces to the desired shape, a workpiece can be machined to a desired shape in, e.g., a laser machining. The shape to which the optical fibers 30(s, t) are bundled is not limited to a circular shape (FIG. 5(C)), a square or rectangular shape (FIG. 5(D)) or the like and can be of any one of the various other shapes. The number of the optical fibers 30(s, t) to be bundled can be chosen as desired or as need be.

In FIGS. 5(A) and 5(B), various symbols or parameters are taken as follows:

SM: the predetermined position to which the laser beams are to be collected f100: the focal length of the collective lens 100

T2, T3: Distance between the position SM and the center of the collective lens 100 in the direction of the optical axis of the collective lens 100

S2, S3: distance between the center of the collective lens 100 and the emission surfaces of the optical fibers 30(s, t) in the direction of the optical axis of the collective lens 100

Further, the parameters S2, T2 and S3, T3 are set as follows:

$$1/S2+1/T2=1/f100$$

$$1/S3+1/T3=1/f100, \text{ and } S3>S2$$

As is clear in comparison of FIG. 5(A) with FIG. 5(B) in dependence with the foregoing equations, the longer the distance Sx from the emission surfaces of the optical fibers 30(s, t) to the center of the collective lens 100 becomes, the shorter the distance Tx from the center of the collective lens 100 to the position SM becomes. Further, the shorter the distance Tx, the smaller the collected beam spot distance Sout. As the collected beam spot distance $S_{out}$ is made smaller, the laser output per unit area is enhanced, and the enhanced laser output is effective for laser machining or the like. Although the position SM spaced the distance Tx from the collective lens 100 is set as a beam collecting spot in this particular embodiment, the position of the distance f100 from the collective lens 100, namely, the position at which the focal point of the collective lens 100 is located may be set as the b am collecting spot.

(Configuration and Arrangement of First Lenses of Optical Waveguide)

Next, description will be made with reference to FIGS. 6(A) and 6(B) as to the configuration and arrangement of first lenses (i.e., first lenses 22b, 22c) of the optical waveguide 20.

In the arrangement shown in FIGS. 6(A) and 6(B), each lens is arranged with the focal axis being inclined to be directed toward the emission surface of the waveguide, and the lens is positioned having displaced in the beam traveling direction (Z-axis direction) and in the fast axis direction (X-axis direction) to locate the lens at a first predetermined distance from the corresponding emitting part.

The arrangement of the first lens 22b corresponding to an emitting part 12(2, 1) in the case of the optical axis of the first lens 22b being inclined will be described with reference to FIGS. 6(A) and 6(B). FIG. 6(A) exemplifies an arrangement for practicing the method of "bundling" laser beams, while FIG. 6(B) exemplifies an arrangement for practicing the method of "condensing" laser beams.

(Arrangement for Bundling Beams with Optical Axis Being Inclined)

Referring to FIG. 6(A), the first lens 22c is arranged with the optical axis Kc thereof being in alignment with the line which connects an emitting part 12(3, 1) with the laser collecting position F0 (i.e., inside an optical fiber 30(1, 1) and outside the optical waveguide 20(1, 1) in this particular instance). Further, the first lens 22c is positioned with its principal point Cc being away by its focal length "f" from a corresponding emitting part 12 (3, 1).

With this arrangement, the laser beam output from the emitting part 12(3, 1) passes through the first lens 22c and is transformed to that having its width which is almost uniform over the length. The focal length "f" of the first lens 22c is selected taking the diameter of the optical fiber 30(1, 1) into consideration for the reason that elongating the focal length "f" causes the laser beam to be widen after passing through the first lens 22c.

For arrangement of the first lens 22b, first of all, based on the numerical aperture NA represented by the sine of a maximum acceptance angle at which the laser beam is entered, the incident angle θ to the optical fiber 30 is decided as follows:

θ<arc sin NA

Further, the distances Lx1 and Lz1 through which the principal point Cb of the first lens 22b is to be offset in the fast axis direction and in the beam traveling direction from the corresponding emitting part 12(2, 1) are determined by the following equations.

$Lx1 = f*\sin \theta$ $Lz1 = f*\cos \theta$

Then, the distance in the fast axis direction between the emitting parts 12(2, 1) and 12(3, 1) is taken as "d", and the half of the width of the laser beam whose width is almost uniform over its length is taken as "b", wherein the distance (Mz1+Nz1) in the Z-axis direction between the emitting part 12(2, 1) and the laser collecting position F0 is determined as follows:

$Mz1 = d/\tan \theta$ $Nz1 = b/\sin \theta$

As shown in FIG. 6(A), the distance L between the emitting part 12(3, 1) and the laser collecting position F0 is almost the length of the optical waveguide 20 in the laser traveling direction. Therefore, the length of the optical waveguide 20 is chosen to make the following equation hold.

$d/\tan \theta + b/\sin \theta$ = (nearly optical waveguide length in Z-axis direction)

The same processing can be done for other emitting parts, so that the laser beams from all of the emitting parts 12(m, n) at the same position in the slow axis direction are efficiently collected to a corresponding one of the optical fibers 30.

Where the incident angle θ of the laser beam to the optical fiber 30(1, 1) (i.e., the angle which the traveling direction of the laser beam within the optical fiber makes with the lengthwise direction of the optical fiber) is set to a small value, the optical waveguide 20(1, 1) is enlarged in length in the Z-axis direction. However, the first to fifth embodiments of refraction means referred to later can not only shorten the length of the optical waveguide 30(1, 1) in the Z-axis direction, but also diminish the incident angle θ of the laser beam to the optical fiber 30(1, 1). Thus, it is possible to make an improvement in the efficiency of collecting the laser beams and the miniaturization of the laser collecting device compatible with each other.

(Arrangement for Condensing Laser Beams with Optical Axis being Inclined)

FIG. 6(B) shows the arrangement for this purpose, in which the first lens 22c is arranged with the optical axis Kc thereof being in alignment with the line which connects an emitting part 12(3, 1) with the laser collecting position (i.e., inside the optical fiber 30(1, 1) and outside the optical waveguide 20(1, 1) in this particular instance). Further, the first lens 22c is positioned with its principal point Cc being away a farther distance "S" than its focal length "f" from a corresponding emitting part 12(3, 1). Then, the distance between the principal point Cc and the incidence surface of the optical fiber 30(1, 1) is taken as "T", and the parameters "f", "S" and "T" are determined to make the following equations hold.

$1/f = 1/S + 1/T$

Because of S+T=L, the parameters "S" and "T" can be obtained as follows:

$S = \{L - \sqrt{(L^2 - 4*L*f)}\}/2$ $T = \{L + \sqrt{(L^2 - 4*L*f)}\}/2$ (provided: $S<T$)

With this configuration, the laser beam output from the emitting part 12(3, 1) is condensed to have its width narrowed gradually after passing the first lens 22c.

For arrangement of the first lens 22b, first of all, the incidence angle θ of the beam from the lens 22b to the optical fiber 30 is determined as follows:

θ<arc sin (NA)

Further, the distance from the emitting part 12(2, 1) to the incidence surface of the optical fiber 30(1, 1) is taken as "L1", the distance from the emitting part 12(2, 1) to the principal point Cb of the first lens 22b is taken as "S1", and the distance from the principal point Cb of the first lens 22b to the incidence surface of the optical fiber 30(1, 1) is taken as "T1", wherein th following equations hold.

$L1 = d/\sin \theta$ $S1 = \{L1 - \sqrt{(L1^2 - 4*L1*f)}\}/2$ $T1 = \{L1 + \sqrt{(L1^2 - 4*L1*f)}\}/2$ Further, the distances Lx2 and Lz2 through which the principal point Cb of the first lens 22b is to be offset in the fast axis direction and in the beam traveling direction from the corresponding emitting part 12(2, 1) are determined by the following equations.

$Lx2 = S1*\sin \theta$ $Lz2 = S1*\cos \theta$

The distance "L" in the Z-axis direction between the emitting part 12 (3, 1) and the incidence surface of the optical fiber 30(1, 1) is determined as follows:

$L = d/\tan \theta$

The distance "L" between the emitting part 12(3, 1) and the optical fiber 30(1, 1) is almost the length of the optical waveguides 20 in the beam traveling direction, as shown in FIG. 3(A). Therefore, the length of the optical waveguides 20 is chosen to make the following equation hold.

$d/\tan \theta$ = (almost the length of waveguides 20 in Z-axis direction)

The same processing can be done for other emitting parts, so that the laser beams from all of the emitting parts 12(m, n) at the same position in the slow axis direction are efficiently collected to a corresponding one of the optical fibers 30.

Here, where the incident angle θ of the laser beam to the optical fiber 30(1, 1) is set to a small value (i.e., the angle which the traveling direction of the laser beam within the optical fiber makes with the lengthwise direction of the optical fiber is made small), the length of the optical waveguide 20(1, 1) in the Z-axis direction is enlarged. However, the first to fifth embodiments of refraction means referred to later can not only shorten the length of the optical waveguide 30(1, 1) in the Z-axis direction, but also diminish the incident angle θ of the laser beam to the optical fiber 30(1, 1). Thus, it is possible to make the improvement in the efficiency of collecting the laser beams and the miniaturization of the laser collecting device compatible with each other.

In the foregoing embodiment, the focal lengths "f" of the first lenses 22a–22e are kept constant to set the distances "S1" different for the respective first lenses. However, where the distances "S" are to be kept constant, the focal lengths "f" of the first lenses 22a–22e may be set to have different values on a lens-by-lens basis. In this case, the distances "S1" are kept constant, and the focal lengths "f" and the distance "T1" for each first lens are determined as follows:

$$f = S1 - S1^2/L1$$

$$T1 = L1 - S1$$

In this modified case, the first lenses have different focal lengths "f" and hence, different curvatures. The farther the emitting part goes away from the center of the optical fiber in the fast axis direction (in other words, the larger the incident angle of the beam to the optical fiber becomes), the longer the distance "L1" becomes and the larger the focal length "f" of the first lens, thereby enlarging the lens curvature. Therefore, by making the distances "S1" constant, the effective diameters of the first lenses can be made almost constant. This advantageously results in increasing the freedom in design of the first lenses under the circumstance that the space between the first lenses is restrained strictly.

In the case that the cross-section of the first lenses are true circles, the characteristic thereof does not change even when the lens surfaces of the first lenses are tilted about the center axes (Pb, Pc in FIGS. 6(A) and 6(B)) of the true circles. Thus, if the first lens shown in FIG. 6(A) is turned to make the focal axis thereof almost parallel with the traveling direction of the laser beam entered thereinto, the same effect as that accomplished in FIG. 6(A) can be realized without tilting the focal axis of the first lens. The same is true with respect to the configuration of FIG. 6(B).

(Detailed Configuration of Laminated Optical Waveguides)

Next, the detailed configuration of the laminated optical waveguide array 200 shown in FIG. 3(A) will be described with reference to FIGS. 7–10. The laminated optical waveguide array 200 is modified in relation to the spacer member interposed between two adjoining waveguides 20(s, t), and various embodiments or modifications of the spacer means will be described hereafter.

(First Embodiment of Spacer Means)

In this embodiment, as shown in FIGS. 7(A) and 7(B), the spacer means interposed between two adjoining optical waveguides 20(s, t) is embodied by cylindrical spacer members 25a. In order to make the laser beams entered into each optical waveguide travel as they are reflected fully, the boundary portion in contact with the optical waveguide 20 (i.e., the portion in contact with the optical waveguide 20) is required to be lower in refractive index than the optical waveguide 20. For example, where the waveguide 20 is made of quartz (silica) glass having the refractive index of about 1.45, the boundary portion can be the air (the refractive index of about 1.00).

FIG. 7(A) is an explanatory view showing the state that cylindrical spacer members 25a are inserted between two adjoining optical waveguides (the optical waveguides 20(1, 1) and 20(1, 2) in this example). FIG. 7(B) shows an example of a perspective view of a laminated optical waveguide array 200 which laminates the optical waveguide 20(s, t) and the cylindrical spacer members 25 in alternate fashion. For the purpose of explaining the state of lamination, FIGS. 7(A) and 7(B) do not show the shape of the optical waveguide 20 as FIG. 2 does, but show it as a square for brevity.

Required to the cylindrical spacer members 25a are that the refractive index be lower than that of the optical waveguide 20(s, t) and that the error thereof in diameter, namely "Ra" shown in FIG. 7(A) be small and therefore, the spacer member be highly precise.

Favorably, optical fibers can be used as the cylindrical spacer members 25a. It is relatively easy to obtain the optical fibers whose refractive index is smaller than that of the optical waveguides 20(s, t) wherein the refractive index of the quartz glass is about 1.45). Further, in terms of the precision in diameter, the optical fibers whose error in diameter are within the range of several tens micrometer through several hundred micrometer are relatively easily available. Thus, the space between adjoining optical waveguides which constitutes respective layers of the laminated optical waveguide array 200 can be set precisely, so that the beam coil acting efficiency can be improved and the laminated optical waveguide assembly can be constructed relatively at lower cost.

For example, where the length Dw of each beam emitting part 12 in the slow axis direction is 200 μm and the distance Dp between each beam emitting part 12 and the next thereto is 200 μm, the depth of the optical waveguide 20(s, t) in the slow axis direction is set to 200 μm and the diameter (Ra) of the cylindrical spacer members 25a is set to 200 μm, whereby there can be constituted a laminated optical waveguide array 200 capable of efficiently collecting the laser beams to a finer optical fiber 30(s, t).

It is to be noted that the cylindrical spacer members 25a in the fast axis direction can be arranged or oriented in any direction as long as they are laid in a plane extending in the fast axis direction (X-axis direction), i.e., in parallel with an X-Z plane. That is, the cylindrical spacer members 25a can be laid in parallel with X-axis or Y-axis or in different directions with each other with the axes being in parallel with the X-Y plane.

Where the cylindrical spacer members 25a are put between adjoining optical waveguides 20(s, t), a space not occupied by the cylindrical spacer members 25a remains therebetween. Further, since the respective layers (the layer of the optical waveguide 20(s, t) and the layer of the cylindrical spacer members 25a) of the laminated optical waveguide array 200 are not secured, the shape of the array 200 tends to be unstable. To this end, a filler is filled up in the space not occupied by the cylindrical spacer members 25a, to secure the respective layers, whereby the waveguide array 200 can be maintained stable in shape. In addition, an error can be restrained from occurring by the cause of each optical waveguide 20 getting out of position.

The filler is of the type having a smaller refractive index than the optical waveguide 20(s, t) and is, for example, a kind of ultraviolet-curable resins. The resin is able to be liquefied and to be filled in a space before going solid and is able to secure the respective layers after going solid. In addition thereto, the resin does not go solid as time goes, but can go solid by being applied with ultraviolet rays when necessary to be made go solid. Thus, the resin is suitable to secure minutes members like the cylindrical spacer members $25b$ having the diameter of several-tens micrometer through several-hundreds micrometer after they are arranged at proper positions.

Besides using the filler, there can be used a method of mechanically securing the waveguide arrays 200, as described later. Where no filler is employed, the air is filled in the space of the layer in which the cylindrical spacer members $25a$ are put. For example, where the optical waveguide 20 is made of quartz glass whose refractive index is about 1.45, the air filled in the space of the layer in which the cylindrical spacer members $25a$ are put has the refractive index of about 1.00 which is smaller than that of the optical waveguide 20. In this case, therefore, the space can be maintained to be a smaller refractive index than that of the optical waveguide 20 without being filled with the filler.

FIG. 10 shows an example of mechanically securing the laminated optical waveguide array 200. In this example, The waveguide array 200 is secured under pressure in the slow axis direction (Y-axis direction) by means of two securing members 29, 29, which are connected to each other by means of bolts or the like. Since a stress caused by the securing members 29 is exerted on the opposite end surfaces of the waveguide array 200 in the direction of lamination (Y-axis direction), it is preferable to provide a buffer member $28d$ having a smaller refractive index than the optical waveguides 20, between each end surface and each securing member 29, so that the waveguide array 200 can be adequately prevented from being deformed or damaged.

(Second Embodiment of Spacer Means)

As shown in FIGS. 8(A) and 8(B), the second embodiment utilizes sphere spacer members $25b$ as the spacer member 25 interposed between the adjoining optical waveguides $20(s, 5)$. Like the first embodiment of the refraction means, where the optical waveguides 20 are made of quartz glass having the refractive index of about 1.45, the boundary part can be the air (refractive index: about 1.00).

FIG. 8(A) is an explanatory view showing the state that sphere spacer members $25b$ are interposed between two adjoining optical waveguides (the optical waveguides $20(1, 1)$ and $20(1, 2)$ in this example). FIG. 8(B) shows a perspective view of a laminated optical waveguide array 200 which laminates the optical waveguide $20(s, t)$ and the sphere spacer members $25b$ in alternate fashion. For the purpose of explaining the state of lamination, FIGS. 8(A) and 8(B) do not show the shape of the optical waveguide 20 as FIG. 2 does, but show it as a square for brevity.

Required to the sphere spacer member $25b$ are that the refractive index be lower than that of the optical waveguide $20(s, t)$, that the error thereof in diameter, namely "Rb" shown in FIG. 8(A) be small and therefor that the spacer members $25b$ be highly precise.

Favorably, spacer balls as used in LCD panels or the like can be used as the sphere spacer member $25b$. It is relatively easy to obtain the spacer balls whose refractive index is smaller then that of the optical waveguide $20(s, t)$ (i.e., quartz glass has the refractive index of about 1.45). In terms of the precision in diameter, the spacer balls whose error in diameter is within the range of several tens micrometer through several hundred micrometer are relatively easily available. Thus, the space between adjoining optical waveguides 20 which constitutes respective layers of the laminated optical waveguide array 200 can be set precisely, so that the beam collecting efficiency can be improved and the laminated optical waveguide array 200 can be constructed relatively at lower cost.

For example, where in FIG. 3(A), the width Dw of each beam emitting part 12 in the slow axis direction is 200 μm (micrometer) and the distance Dp between each beam emitting part 12 and the next thereto is 200 μm, the depth of the optical waveguide $20(s, t)$ in the slow axis direction is set to 200 μm and the diameter "Ra" of the sphere spacer members $25b$ is set to 200 μm, whereby there can be constituted a laminated optical waveguide array 200 capable of efficiently collecting the laser beams to a finer optical fiber $30(s, t)$.

Where the sphere spacer members $25b$ are put between adjoining optical waveguides $20(s, t)$, a vacancy not occupied by the sphere spacer members $25b$ remains therebetween. The vacancy and the filler therein are same as those in the first embodiment of the spacing means, and the description therefor are omitted for brevity. Besides using the filler, the waveguide array 200 can be secured mechanically. The method or manner of mechanically securing the waveguide array 200 is the same as that described in the first embodiment of the spacing means, and the description therefor are omitted for brevity. Further, spacer balls include those with the character of strong adhesion. Where spacer balls of such character are used, each layer of the waveguide array 200 can be secured without using either the filler or the securing members 29.

(Third Embodiment of Spacer Means)

As shown in FIGS. 9A) and 9B), the third embodiment utilizes a plate-like spacer members $25c$ interposed between the adjoining optical waveguides $20(s, 5)$. Although the example shown in FIG. 9(A) shows one piece of the plate-like spacer member $25c$ for each space between the waveguides 20, modifications may be provided. In one modified form, plural thinner plate-like spacer members are laminated in the Y-axis direction to have a required depth Rc. In another modified form, plural pieces of the plate-like spacer members $25c$ each of which has the required depth Rc and a smaller divided area may be arranged within the X-Y plane thereby to constitute one space layer. Also, like the first embodiment of the spacer means, where the optical waveguides 20 are made of quartz glass having the refractive index of about 1.45, the boundary part between each optical waveguide 20 and the spacer member which part is formed with the piece plate-like spacer members $25c$ being arranged within the X-Z plane can be the air (refractive index: about 1.00). In other words, the layer for the spacer member is not required to be occupied fully with the plate-like spacer member $25c$ and can have the parts vacant.

FIG. 9(A) is an explanatory view showing the state that the plate-like spacer members $25c$ is interposed between two adjoining optical waveguides (the optical waveguides $20(1, 1)$ and $20(1, 2)$ in this example). FIG. 9(B) shows an example of a perspective view of a laminated optical waveguide array 200 in which the optical waveguide $20(s, t)$ and the plate-like spacer members $25c$ are interposed in alternate fashion. For the purpose of explaining the state of lamination, FIGS. 9(A) and 9(B) do not show the shape of the optical waveguide 20 as FIG. 2 does, but show it as a square for brevity.

Required to the plate-like spacer members $25c$ are that the refractive index thereof be lower than that of the optical waveguides $20(s, t)$, that the error thereof in diameter, namely "Rc" shown in FIG. 9(A) be small and therefore, that the spacer members $25c$ be highly precise.

It is relatively easy to obtain the plate-like spacer members $25c$ whose refractive index is smaller than that of the optical waveguide 20(s, t), for which quartz glass is used having the refractive index of about 1.45. Further, in terms of the precision in thickness, the plate-like spacer members 25c whose error in thickness is within the range of several tens micrometer through several hundred micrometer are relatively easily available. Thus, the space between adjoining optical waveguides 20 which constitute respective layers of the laminated optical waveguide array 200 can be set precisely, so that the beam collecting efficiency can be improved and the laminated optical waveguide assembly can be constructed relatively at lower cost.

For example, where in FIG. 3(A), the width Dw of each beam emitting part 12 in the slow axis direction is 200 μm and the distance Dp between each beam emitting part 12 and the next thereto is 200 μm, the thickness of the optical waveguide 20(s, t) in the slow axis direction is set to 200 μm and the thickness "Rc" of the plate-like spacer members 25a is set to 200 μm, whereby there can be constituted a laminated optical waveguide array 200 capable of efficiently collecting the laser beams to a finer optical fiber 30(s, t).

Where the plate-like spacer member 25c is put between adjoining optical waveguides 20(s, t), a vacancy not occupied by the plate-like spacer members 25b may remains therebetween for example where plural pieces of the plate-like spacer members 25c are arranged within one layer. The vacacy and the filler therein are same as those in the first embodiment of the spacer means, and the description therefore are omitted for brevity. Besides using the filler, the waveguide array 200 can be secured mechanically. The method or manner of mechanically securing the waveguide array 200 is the same as that described in the first embodiment of the spacer means, and the description therefore is omitted for brevity.

In the foregoing description, members having a lower refractive index than that of the optical waveguides 20 are used as the spacer members 25 for the laminated optical waveguide array 200. However, the role of the spacer members 25 is to restrain the laser beams entered into each optical waveguide 20 from shining therethrough and to make the laser beams advance within the optical waveguide 20 as they reflect fully. Therefore, any other member capable of reflecting fully may be used for the spacer members 25. For example, in FIGS. 9(A) and 9(B), mirrors or the like capable of reflecting the laser beams fully can be used as the plate-like spacer member 25c thereby to constitute the laminated optical waveguide array 200. In this instance, since the laser beams can be surer to reflect the laser beams fully in the slow axis direction, the beam collecting efficiency can be further enhanced.

(Embodiments of Refraction Means)

Hereafter, description will be made of the first to fifth embodiments of refraction means which are capable of shortening the length of the optical waveguides 20 in the Z-axis direction and also capable of making smaller the angle which the traveling direction of the laser beam within the optical fiber 30 makes with the lengthwise direction of the optical fiber 30, so that the enhancement of the beam collecting efficiency of the laser beams can be compatible with the miniaturization of the laser beam collecting device.

(First Embodiment of Refraction Means)

FIG. 11(A) shows the general configuration of the first embodiment of the refraction means. In this embodiment, each optical waveguide 20 is formed at its emission surface with a concave curved surface which is curved in the fast axis (X-axis) direction. The laser beams 2a, 2e entered into the optical waveguide 20 are gathered at a collecting position Fα which is outside the emission surface of the optical waveguide 20.

With this configuration, the beam collecting position is displaced to the position Fα (shown in FIG. 7(A)) far away from a beam collecting position F0 which is made in the case that the flat emission surface of the optical wave guide 20 and the flat incidence surface of the optical fiber 30 are arranged in face to face relation as shown in FIG. 7(B). As a consequence, the angle which the traveling direction of the laser beams within the optical fiber 30 makes with the lengthwise direction of the optical fiber 30 can be made smaller and hence, the loss which the laser beams entered into the optical fiber 30 cause by shining therethrough can be restrained, so that the beam collecting efficiency can be enhanced.

In FIGS. 11(A) and 11(B), the laser beam 2a represents the laser beam that has passed the first lens 22a (FIG. 2), while the laser beam 2e represents the laser beam that has passed the first lens 22e (FIG. 2). Further, the general shape of the concave curved surface formed at the emission surface of each optical waveguide 20 is aspherical in this instance as illustrated in a perspective view right-below FIG. 7(A) and does not form any curved surface in the slow axis direction (Y-axis direction).

The state of the laser beam 2a being refracted will be described with reference to FIGS. 11(A) and 11(B). In the illustrated example, the refractive index of the optical waveguide 20 is taken as "n1" and those of the vacancy (e.g., the atmospheric air) and the optical fiber 30 are taken as "n0" and "n2", respectively. Further, the relations n0<n1 and n0<n2 exist in the example of FIGS. 12(A) and 12(B).

FIG. 12(A) shows the part "a" in FIG. 11(A) in an enlarged scale. The laser beam 2a advances within the optical waveguide 20 and reaches the curved emission surface of the same at an angle $\theta 1$. Because of the relation n0<n1, the laser beam 2a is emitted at an angle $\theta 0$ from the curved emission surface of the optical waveguide 20. At this time, the following relation holds.

$$n1 * \sin \theta 1 = n0 * \sin \theta 0$$

Also, because of n0<n1, the following relation also holds.

$$\theta 1 < \theta 0$$

Thus, the refraction at the angle $\theta 0$ makes the incident angle $\theta_{out}$ of the laser beam (taken as 2a' here) to the incidence surface of the optical fiber 30 smaller. This laser beam 2a' advances within the vacancy of the refractive index "n0" and reaches the incidence surface of the optical fiber 30 at the incident angle $\theta_{out}$. Because the relation of the refractive indexes therebetween is n0<n2, the laser beam 2a' advances at an angle $\theta_z$ after being entered into the incidence surface of the optical fiber 30. At this time, the following relation holds.

$$n0 * \sin \theta_{out} = n2 * \sin \theta z$$

Also, because of n0<n2, the following relation also holds.

$$\theta z < \theta_{out}$$

As describe above, the angle "$\theta z$" which the traveling direction of the laser beam 2a' within the optical fiber 30 makes with the lengthwise direction (Z-axis direction) of the optical fiber 30 becomes smaller then the angle $\theta_{in}$ which the traveling direction of the laser beam 2a within the optical waveguide 20 makes with the lengthwise direction (Z-axis direction) of the optical fiber 30. Accordingly, the laser beam entered into the optical fiber 30 can be restrained from coming therethrough, so that the beam collecting efficiency can be enhanced.

Next, description will be given with reference to FIG. 12(B) of how to obtain the concave curved surface at the emission surface of the optical waveguide 20. Plural laser beams entered into each optical waveguide 20 respectively pass through the first lenses 22a–22e (FIG. 2) formed on the incidence surface of each optical waveguide 20 thereby to be refracted, and all of the laser beams advance toward an imaginary focal point F0 to be collected thereto. The shape of the concave curved surface at the emission surface of the optical waveguide 20 is important in converting the beam collecting point from the imaginary focal point F0 to the focal point Fα.

First of all, an imaginary circle of a radius R which circle is indicated by the two-dot-dash line in FIG. 12(B) is drawn with the center being set on the imaginary focal point F0. All of the laser beams are thus caused to reach the imaginary focal point F0 after passing across the imaginary circle. In this case, the distance from the imaginary circle to the imaginary focal point F0 is represented by "R". Assuming now that the refractive index of the optical waveguide is "n1" and that no boundary exists between the imaginary focal point F0 and the imaginary circle, which are inside the optical waveguide 20, the optical path length is calculated by the following equation, $$n1*R$$

and is constant with respect to all of the laser beams.

Now, let it be considered that the emission surface having the curved emission surface exists between the imaginary circle and the imaginary focal point F0. Further, it is then assumed that symbols "La" and "Lb" respectively represent the distance from the imaginary circle to the curved emission surface on a center optical path shown by one-dot-dash line extending in the Z-axis direction in FIG. 12(B) and the distance from the curved emission surface to the focal point Fα on the center optical path. It is also assumed that the symbols "La'" and "Lb'" respectively represent the distance from the imaginary circle to the curved emission surface on an arbitrary laser beam (e.g., laser beam 2a in FIG. 12(B) in this instance) and the distance from the curved emission surface to the focal point Fα on the same laser beam. In order for all of the laser beams to be collected onto the focal point Fα, the optical path length must be constant likewise the case that the concave curved emission surface does not exist. Therefore, where the symbol "n0" is taken as the refractive index of the vacancy which is ahead of the emission surface of the optical waveguide 20, the following equation (1) must be satisfied.

$$n1*La+n0*Lb=n1*La'+n0*Lb' \qquad (1)$$

The shape of the concave curved emission surface, i.e., the aspherical surface, is obtained by calculating such emitting points (i.e., passing points on the concave curved emission surface) that satisfy the foregoing equation (1) for all the laser beams advancing within the optical waveguide 20 and by connecting such emitting points one after another.

Next, the beam parameter product of the laser beams will be described with reference to FIG. 12(C). Taking symbols "λ" and "θ" respectively as the wavelength of the laser beams and the whole angle or spreading angle shown in FIG. 12(C), the beam waist "bw" which is generated by the diffraction limited of beams such as laser beams is given by the following equation (2).

$$bw=4*\lambda/(\pi*\theta) \qquad (2)$$

Thus, the larger the whole angle θ, the smaller the beam waist "bw", so that the laser beams can be collected to a spot of a smaller size.

Further, the beam parameter product (BPP) is given by the following equation.

$$BPP=(bw/2)*(\theta/2) \qquad (3)$$

By substituting the equation (2) into the equation (3), the following equation (4) can be obtained.

$$BPP=\lambda/\pi \qquad (4)$$

In accordance with the equation (4) above, it can be concluded that the beam parameter product (BPP) does not depend on the whole angle θ, and hence that the beam collection can be done without deteriorating the beam parameter product (BPP) even if the whole angle θ is enlarged. For this reason, where each optical waveguide 20 is shortened in length in the Z-axis direction thereby to enlarge the whole angle θ, the incident angle to the optical fiber 30 is enlarged, but it can be made small sufficiently by including or forming the concave curved surface shown in FIGS. 12(A) and 12(B) at the emission surface of each optical waveguide 20.

Consequently, it can be realized not only to make the size of the optical waveguide array 200 smaller (i.e., to make the length thereof in the Z-axis direction shorter), but also to make the incident angle of the beam to the optical fiber 30 smaller, so that an improvement in the beam collecting efficiency and the miniaturization of the laser emission device can be accomplished.

(Second Embodiment of Refraction Means)

FIG. 13(A) shows the general configuration of the second embodiment of the refraction means. This second embodiment features including a concave curved surface which is curved only in the X-axis direction, not at the emission surface of each optical waveguide 20, but at the incidence surface of the optical fiber 30. In this example, laser beams (beams 2a, 2e in this case) entered into each optical waveguide 20 are collected to a beam collecting position Fβ which is outside the emission surface of the waveguide 20, likewise the first embodiment of the refraction means.

With this configuration, the beam collecting position is displaced to the position Fβ (shown in FIG. 13(A)) far away from the beam collecting position F0 which is made in the case that the flat emission surface of the optical waveguide 20 and the flat incidence surface of the optical fiber 30 are arranged in face to face relation as shown in FIG. 13(B). As a consequence, the angle which the traveling direction of the laser beams within the optical fiber 30 makes with the lengthwise direction of the optical fiber 30 can be made smaller thereby to reduce or restrain the loss which the laser beams entered into the optical fiber 30 cause by shining therethrough, so that the beam collecting efficiency can be enhanced.

Further, the general shape of a concave curved surface formed at the incidence surface of each optical fiber 30 is aspherical in this example as illustrated in a perspective view right-below FIG. 9(A) and does not form any curved surface in the slow axis direction (Y-axis direction).

Next, the state of the laser beam 2a being refracted will be described with reference to FIG. 13(C). In this example, a symbol "n1" is taken as the refractive index of the optical waveguide 20, and symbols "n3" and "n2" are taken as the refractive indexes of the vacancy (e.g., a filler or the like having a predetermined refractive index) and the optical fiber 30, respectively. Further, the relation n1<n3<n2 exists in the example of FIGS. 13(A) and 13(C).

FIG. 13(C) shows the part "b" in FIG. 13(A) in an enlarged scale. The laser beam 2a advances within the optical waveguide 20 and reaches the emission surface of the same at an angle $\theta_{in}$. Because of the relation n1<n3, the laser beam 2a is emitted at an angle $\theta_{out}$ from the emission surface of the optical waveguide 20. At this time, the following equation holds.

$$n1 * \sin \theta_{in} = n3 * \sin \theta_{out}$$

Also, because of n1<n3, the following relation also holds.

$$\theta_{out} < \theta_{in}$$

Thus, the refraction at the angle $\theta_{out}$ makes the incident angle $\theta_{out}$ of the laser beam (taken as 2a' here) to the incidence surface of the optical fiber 30 smaller. This laser beam 2a' advances within the filler of the refractive index "n3" and reaches the incidence surface having the concave curved surface of the optical fiber 30 at the incident angle θ3. Because the relation of the refractive indexes therebetween is n3<n2, the laser beam 2a' advances at an angle θ2 after being entered into the incidence surface of the optical fiber 30. At this time, the following equation holds.

$$n3 * \sin \theta3 = n2 * \sin \theta2$$

Also, because of n3<n2, the following relation also holds.

$$\theta2 < \theta3$$

As describe above, an angle "$\theta_z$" which the traveling direction of the laser beam 2a' within the optical fiber 30 makes with the lengthwise direction (Z-axis direction) of the optical fiber 30 becomes smaller than the angle $\theta_{in}$ which the traveling direction of the laser beam 2a within the optical waveguide 20 makes with the lengthwise direction (Z-axis direction) of the optical fiber 30. Accordingly, the laser beam entered into the optical fiber 30 can be restrained from coming therethrough, so that the beam collecting efficiency can be enhanced.

The shape of the concave curved surface of the optical fiber 30 can be obtained in the same manner as described in the foregoing first embodiment of the refraction means and therefore, the description thereon will be omitted for brevity.

(Third Embodiment of Refraction Means)

FIG. 14(A) shows the general configuration of the third embodiment of the refraction means. This third embodiment features including a curved surface of not concave but convex which is curved only in the X-axis direction, at the emission surface of each optical waveguide 20. In this example, laser beams (beams 2a, 2e in this case) entered into each optical waveguide 20 are collected to a beam collecting position F0 which is inside the emission surface of the waveguide 20.

With this configuration, the angle which the traveling direction of the laser beams within the optical fiber 30 makes with the lengthwise direction of the optical fiber 30 can be made smaller thereby to reduce or restrain the loss which the laser beams entered into the optical fiber 30 cause by shining therethrough, so that the beam collecting efficiency can be enhanced Further, the general shape of a convex curved surface formed at the emission surface of each optical waveguide 20 is aspherical in this example like the foregoing first embodiment of the refraction means and does not form any curved surface in the slow axis direction (Y-axis direction).

Next, the state of the laser beam 2e being refracted will be described with reference to FIG. 15(A). In this example, a symbol "n1" is taken as the refractive index of the optical waveguide 20, and symbols "n0" and "n2" are taken as the refractive indexes of the vacancy (e.g., the atmospheric air) and the optical fiber 30, respectively. Furthers the relations n0<n1 and n0<n2 exist in the example illustrated in FIGS. 14(A) and 15(A).

FIG. 15(A) shows the part "c" in FIG. 14(A) in an enlarged scale. The laser beam 2e advances within the optical waveguide 20 and reaches the emission surface of the same at an angle θ1. Because of the relation n0<n1, the laser beam 2e is emitted at an angle θ0 from the emission surface of the optical waveguide 20. At this time the following relation holds.

$$n1 * \sin \theta1 = n0 * \sin \theta0$$

Also, because of n0<n1, the following relation also holds.

$$\theta1 < \theta0$$

Thus, the refraction at the angle θ0 makes the incident angle $\theta_{out}$ of the laser beam 2e to the incidence surface of the optical fiber 30 smaller. This laser beam (taken as 2e' here) advances within the vacancy of the refractive index "n0" and reaches the incidence surface of the optical fiber 30 at the incident angle $\theta_{out}$. Because the relation of the refractive indexes therebetween is n0<n2, the laser beam 2e' advances at an angle $\theta_z$ after being entered into the incidence surface of the optical fiber 30. At this time, the following relation holds.

$$n0 * \sin \theta_{out} = n2 * \sin \theta_z$$

Also, because of n0<n2, the following relation also holds.

$$\theta_z \theta_{out}$$

As describe above, the angle "$\theta_z$" which the traveling direction of the laser beam 2e' within the optical fiber 30 makes with the lengthwise direction (Z-axis direction) of the optical fiber 30 becomes smaller than the angle $\theta_{in}$ which the traveling direction of the laser beam 2e within the optical waveguide 20 makes with the lengthwise direction (Z-axis direction) of the optical fiber 30. Accordingly, the laser beam entered into the optical fiber 30 can be restrained from coming therethrough, so that the beam collecting efficiency can be enhanced.

The shape of the convex curved surface of the optical waveguide 20 can be obtained in the same manner as described in the foregoing first embodiment of the refraction means and therefore, the description thereon will be omitted for brevity.

(Fourth Embodiment of Refraction Means)

FIG. 14(B) shows the general configuration of the fourth embodiment of the refraction means. This fourth embodiment features making the emission surface of each optical waveguide 20 and the incidence surface of each optical fiber 30 both flat and providing between the flat surfaces a filler having a predetermined refractive index. In this example, a beam collecting position F0 to which laser beams (beams 2a, 2e in this case) entered into each optical waveguide 20 are collected may be either inside or outside the emission surface of the waveguide 20. In this particular instance, the beam collecting position F0 is inside the optical waveguide 20. With this configuration, the angle which the traveling direction of the laser beams within the optical fiber 30 makes with the lengthwise direction of the optical fiber 30 can be made smaller thereby to reduce or restrain the loss which the laser beams entered into the optical fiber 30 cause by shining therethrough, so that the beam collecting efficiency can be enhanced.

Next, the state of the laser beam 2a being refracted will be described with reference to FIG. 15(B). In this example, a symbol "n1" is taken as the refractive index of the optical waveguide 20, and symbols "n3" and "n2" are taken as the refractive indexes of the vacancy (e.g., a filler or the like having a predetermined refractive index) and the optical fiber 30, respectively. Further, the relation n1<n3<n2 exists in the example of FIGS. 14(B) and 15(B).

FIG. 15(B) shows the part "d" in FIG. 14(B) in an enlarged scale. The laser beam 2e advances within the optical waveguide 20 and reaches the emission surface of the same at an angle θ1. Because of the relation n1<n3, the laser beam 2e is emitted at an angle $\theta_{out}$ from the emission surface of the optical waveguide 20. At this time, the following relation holds.

$$n1*\sin \theta_{in} = n3*\sin \theta_{out}$$

Also, because of n1<n3, the following relation also holds.

$$\theta_{out} < \theta_{in}$$

Thus, the refraction at the angle $\theta_{out}$ makes the incident angle $\theta_{out}$ of the laser beam 2e to the incidence surface of the optical fiber 30 smaller. This laser beam (taken as 2e') advances within the filler of the refractive index "n3" and reaches the incidence surface of the optical fiber 30 at the incident angle $\theta_{out}$. Because the relation of the refractive indexes therebetween is n3<n2, the laser beam 2e' advances at an angle $\theta_z$ after being entered into the incidence surface of the optical fiber 30. At this time, the following relation holds.

$$n3*\sin \theta_{out} = n2*\sin \theta_z$$

Also, because of n3<n2, the following relation also holds.

$$\theta_z < \theta_{out}$$

As describe above, the angle "$\theta_z$" which the traveling direction of the laser beam 2e' within the optical fiber 30 makes with the lengthwise direction (Z-axis direction) of the optical fiber 30 becomes smaller than the angle $\theta_{in}$ which the traveling direction of the laser beam 2e within the optical waveguide 20 makes with the lengthwise direction (Z-axis direction) of the optical fiber 30. Accordingly, the laser beam entered into the optical fiber 30 can be restrained from coming therethrough, so that the beam collecting efficiency can be enhanced.

(Fifth Embodiment of Refraction Means)

FIG. 14(C) shows the general configuration of the fifth embodiment of the refraction means. In addition to the features of the fourth embodiment, this fifth embodiment features including a convex curved surface curved in the fast axis direction, at the incidence surface of each optical fiber 30. In this example, a beam collecting position F0 to which laser beams (beams 2a, 2e in this case) entered into each optical waveguide 20 are collected is inside the waveguide 20. With this configuration, the angle which the traveling direction of the laser beams within the optical fiber 30 makes with the lengthwise direction of the optical fiber 30 can be made smaller thereby to reduce or restrain the loss which the laser beams entered into the optical fiber 30 cause by shining therethrough, so that the beam collecting efficiency can be enhanced.

Next, the state of laser beam 2a being refracted will be described with reference to FIG. 15(C). Like the foregoing fourth embodiment of the refraction means, the relations n1<n3<n2 exists in the example of FIGS. 14(C) and 15(C). Hereinafter, the differences from the fourth embodiment of the refraction means will be described hereinafter.

The laser beam travels in the same manner as done in the fourth embodiment until it becomes the laser beam 2e'. The laser beam 2e' travels within a filler having the refractive index "n3" and reaches the incidence surface of the optical fiber at an angle θ3. Because of the relation n3<n2, the laser beam 2e' travels at an angle θ2 after being entered into the incident surface of the optical fiber 30. At this time, the following relation holds.

$$n3*\sin \theta3 = n2*\sin \theta2$$

Also, because of n3<n2, the following relation also holds.

$$\theta2 < \theta3$$

Thus, the angle $\theta_z$ which the traveling direction of the laser beam within the optical fiber 30 makes with the lengthwise direction (Z-axis direction) of the optical fiber 30 becomes smaller than the angle "$\theta_{in}$" which traveling direction of the laser beam within the optical waveguide 20 makes with the lengthwise direction (Z-axis direction) of the laser beam. Accordingly, the laser beam entered into the optical fiber 30 can be restrained from coming therethrough, so that the beam collecting efficiency can be enhanced.

It is to be noted that the beam collecting device, the laminated optical waveguide array and the laser emission device according to the present invention are not limited to those configuration, forms, arrangement and the like as described in the forgoing embodiments, and various modifications, additions and deletions may be possible without departing from the gist of the present invention.

The beam collecting device, the laminated optical waveguide array and the laser emission device according to the present invention are applicable to various kinds of apparatus utilizing laser beams such as, for example, laser machining apparatus and the like. The numerical definitions of various parameters used in the foregoing description are by way of examples and are no to be limited to those numerical definitions The shapes, dimensions and the like of the optical waveguide 20 and the optical fiber 30 are not to be limited to those described in the embodiments and indicated in the accompanying drawings. Further, the optical waveguide 20 used in each of the foregoing embodiments has the first lenses 22a–22e machined precisely thereon as shown in FIG. 2 when incorporated into the beam collecting device (laser emission device) as shown in FIG. 1, and the general shape of the optical waveguide 20 is not limited to a triangle shape shown in FIG. 2. Rather, the optical waveguide 20 may remain square or rectangular as depicted in FIGS. 7(A), 8(A) and 9(A).

In the foregoing embodiment, the first lenses are provided at the incidence surface of each optical waveguide as beam collecting means for collecting laser beams entered into the optical waveguide toward a predetermined direction and to a predetermined position. However, in place of providing the first lenses at the incidence surface of each optical waveguide, the incidence surface of each optical waveguide may be made flat, in which modification, a lens array corresponding to the first lenses may be provided between the semiconductor laser array and the optical waveguide array. The beam collecting means can be realized by various methods and means. In addition, where a filler is put between the emission surface of each optical waveguide 20 and the incidence surface of each optical fiber 30, the emission surface of the optical waveguide 20 may be formed with a concave curved surface or a convex curved surface.

Furthermore, the lens used in the present invention may by those wherein so far as one surface thereof is a curvature, the other surface may be either a flat or a curvature.

Although the waveguides described in the embodiments are constituted to collect laser beams from plural emitting parts arranged in the fast axis direction, they may take the configuration to collect laser beams from those arranged in the slow axis direction.

Obviously, numerous modifications and variations of the present invention are possible in light of the above teachings. It is therefore to be understood that within the scope of the appended claims, the present invention may be practiced otherwise than as specifically described herein.

What is claimed is:

1. A beam collecting device comprising:
   a semiconductor laser array having a plurality of laser emitting parts which are arranged in fast and slow axis directions in a plane normal to the traveling direction of emitted laser beams, each for emitting a laser beam of an elliptical cross-section which spreads in said fast and slow axis directions as it travels, said laser emitting parts being grouped into plural groups separated in said slow axis direction; and
   a laminated optical waveguide array composed of a plurality of optical waveguides arranged in said slow axis direction to be in alignment respectively with said plural groups, each of said optical waveguides being provided with beam collecting means at an incidence surface thereof for collecting laser beams emitted from said laser emitting parts of each group in said fast axis direction toward a predetermined position thereby to emit the collected laser beams from an emission surface thereof.

2. A beam collecting device as set forth in claim 1, wherein said laminated optical waveguide array comprises:
   a plurality of plate-like optical waveguides made of a material having a predetermined refractive index; and
   a plurality of spacer members having a lower refractive index than that of said optical waveguides and arranged alternately with said optical waveguides.

3. A beam collecting device as set forth in claim 2, wherein each of said spacer members takes the form of one of a cylinder, a sphere and a plate.

4. A beam collecting device as set forth in claim 3, wherein a vacancy which is not occupied by said spacer member between the adjoining waveguides is filled with a resin having a smaller refractive index than that of said optical waveguides, whereby said adjoining waveguides are secured to each other.

5. A beam collecting device as set forth in claim 3, further comprising:
   a securing member for pressuring said laminated optical waveguides at opposite ends thereof in the direction of lamination so as to secure the waveguides entirely.

6. A beam collecting device as set forth in claim 5, wherein said laminated optical waveguide array further comprises:
   buffer members having a smaller refractive index than said optical waveguides and each arranged between each of the opposite ends of said laminated optical waveguides and said securing member.

7. A laser emission device comprising:
   a semiconductor laser array having a plurality of laser emitting parts which are arranged in a fast axis direction as well as in a slow axis direction each for emitting a laser beam of an elliptical cross-section which spreads in said fast and slow axis directions as it travels;
   a plurality of optical fibers;
   a collective lens; and
   a laminated optical waveguide array composed of a plurality of plate-like optical waveguides made of a material having a predetermined refractive index and a plurality of spacer members having a lower refractive index than that of said optical waveguides and arranged alternately with said optical waveguides;
   said optical waveguides being arranged in almost substantially the same space as said laser emitting parts of said semiconductor laser array in said slow axis direction, each having substantially the same width as the length of each of said laser emitting parts, and each having an incidence surface extending in said fast axis direction and an emission surface opposite to said incidence surface in the traveling direction of said laser beam;
   said optical waveguides being laminated in said slow axis direction of said semiconductor laser array so that plural laser beams emitted from plural laser emitting parts separated from other laser emitting parts in said slow axis direction are entered into said incidence surface of a corresponding one of said optical waveguides to be collected in said fast axis direction and so that the collected laser beams are emitted from said emission surface of said corresponding optical waveguide;
   said optical fibers being arranged in said slow axis direction to make incidence surfaces thereof respectively face said emission surfaces of said optical waveguides and having beam emission end portions bundled to take a predetermined shape so that laser beams emitted from said optical waveguides are emitted from said beam emission end portions of said optical fibers to be collected to said predetermined shape; and
   said collective lens being provided for collecting plural laser beams emitted from said beam emission end portions of said optical fibers to a target position.

8. A beam collecting device comprising:
   an optical waveguide for collecting a beam entered into an incidence surface thereof to a predetermined position in a predetermined direction and for emitting said beam from an emission surface;
   an optical fiber; and
   refraction means provided between said optical waveguide and said optical fiber for diminishing the angle which the beam refracted at an incident surface of said optical fiber makes with the axis of said optical fiber in comparison with the angle which the beam before being refracted at said emission surface of said optical waveguide makes with the axis of said optical fiber.

9. A beam collecting device as set forth in claim 8, wherein said refraction means comprises a filler having a predetermined refractive index and interposed between said emission surface of said optical waveguide and said incidence surface of said optical fiber.

10. A beam collecting device as set forth in claim 8, wherein:
    said predetermined position is either outside or inside said optical waveguide; and
    said refraction means comprises a curved surface of either a concave or a convex curved in said fast axis direction, said curved surface being formed at at least one of said emission surface of said optical waveguide and said incidence surface of said optical fiber in dependence on said predetermined position and in dependence on the refractive index of said optical waveguide, the refractive index between said emission surface of said optical waveguide and said incidence surface of said optical fiber and the refractive index of said optical fiber.

11. A laser emission device comprising:

a semiconductor laser array having a plurality of laser emitting parts which are arranged in fast and slow axis directions in a plane normal to the traveling direction of laser beams emitted, each for emitting a laser beam of an elliptical cross-section which spreads in said fast and slow axis directions as it travels, said laser emitting parts being divided into plural groups separated in said slow axis direction;

an optical waveguide array composed of a plurality of optical waveguides each provided with beam collecting means at an incidence surface thereof for collecting laser beams emitted from said laser emitting parts of each group in said fast axis direction and toward a predetermined position thereby to emit the collected laser beams from an emission surface thereof;

a plurality of optical fibers arranged in alignment respectively with said optical waveguides each for entering said collected laser beams emitted from said emission surface of one of said optical waveguides aligned therewith into an incidence surface thereof to emits said collected laser beams from an emission end portion thereof;

a collective lens for further collecting said collected laser beams emitted from each of said optical fibers; and refraction means for diminishing the angle which each of said collected laser beams refracted at said incident surface of each of said optical fibers makes with the axis of each said optical fiber in comparison with the angle which each of said collected laser beams before being refracted at said emission surface of said optical waveguide makes with the axis of each said optical fiber.

12. A laser emission device as set forth in claim 11, wherein said refraction means comprises a filler filled between said emission surface of each of said optical waveguides and said incidence surface of each of said optical fibers aligned with each said optical waveguide.

13. A laser emission device as set forth in claim 11, wherein said refraction means comprises a curved surface having one of a concave and a convex which are curved in said fast axis direction, said curved surface being formed at at least one of said emission surface of each of said optical waveguides and said incidence surface of each of said optical fibers aligned therewith.

14. A laser emission device as set forth in claim 13, wherein:

said predetermined position to which each of said optical waveguides collects said laser beams is either outside or inside each said optical waveguide; and whether to form said curved surface at said emission surface of each said optical waveguide or at said incidence surface of each said optical fiber and whether to make said curved surface either concave or convex depend on said predetermined position, the refractive index of said optical waveguides, the refractive index between said emission surface of each said optical waveguide and said incidence surface of each said optical fiber and the refractive index of said optical fibers.

* * * * *